United States Patent
Ogami et al.

(10) Patent No.: US 9,903,014 B2
(45) Date of Patent: Feb. 27, 2018

(54) SURFACE-COATED CUTTING TOOL

(71) Applicant: MITSUBISHI MATERIALS CORPORATION, Tokyo (JP)

(72) Inventors: Tsuyoshi Ogami, Naka (JP); Tatsuo Hashimoto, Akashi (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 51 days.

(21) Appl. No.: 14/777,052

(22) PCT Filed: Mar. 18, 2014

(86) PCT No.: PCT/JP2014/057334
 § 371 (c)(1),
 (2) Date: Sep. 15, 2015

(87) PCT Pub. No.: WO2014/148488
 PCT Pub. Date: Sep. 25, 2014

(65) Prior Publication Data
 US 2016/0040283 A1    Feb. 11, 2016

(30) Foreign Application Priority Data

Mar. 22, 2013 (JP) ................................. 2013-061010
Mar. 22, 2013 (JP) ................................. 2013-061011
(Continued)

(51) Int. Cl.
 *C23C 14/06*      (2006.01)
 *C23C 14/32*      (2006.01)
 (Continued)

(52) U.S. Cl.
 CPC ............. *C23C 14/325* (2013.01); *B23C 5/10* (2013.01); *C23C 14/022* (2013.01);
 (Continued)

(58) Field of Classification Search
 USPC .......... 51/307, 309; 428/697, 698, 699, 704; 204/192
 See application file for complete search history.

(56) References Cited

U.S. PATENT DOCUMENTS 6,824,601 B2 * 11/2004 Yamamoto .......... C23C 14/0641
                                                  428/699
2007/0184306 A1 * 8/2007 Yamamoto .............. C23C 14/06
                                                  428/697

(Continued)

FOREIGN PATENT DOCUMENTS

CN           1642682 A      7/2005
CN           1675015 A      9/2005
(Continued)

OTHER PUBLICATIONS

International Search Report dated Jun. 17, 2014, issued for PCT/JP2014/057334 and English translation thereof.
(Continued)

*Primary Examiner* — Archene Turner
(74) *Attorney, Agent, or Firm* — Locke Lord LLP; James E. Armstrong, IV; Nicholas J. DiCeglie, Jr.

(57) ABSTRACT

A surface-coated cutting tool of the present invention includes: a hard coating layer which is vapor-deposited on a surface of a tool body made of tungsten carbide-based cemented carbide and has an average thickness of 2 mm to 10 mm, in which (a) the hard coating layer comprises a layer made of complex nitride of Al, Cr, and B in which a ratio (atomic ratio) of the amount of Cr is 0.2 to 0.45 and a ratio (atomic ratio) of the amount of B is 0.01 to 0.1 to the total amount of Al, Cr, and B, and (b) in an area within 100 mm from an edge tip on a flank face of the surface-coated cutting tool, the hard coating layer has a granular crystal grain (Continued)

structure and the average grain size of granular crystal grains is 0.1 mm to 0.4 mm on the surface of the hard coating layer.

12 Claims, 6 Drawing Sheets

(30) Foreign Application Priority Data

Jul. 25, 2013 (JP) ................................ 2013-154110
Jul. 25, 2013 (JP) ................................ 2013-154111

(51) Int. Cl.
  *C23C 30/00* (2006.01)
  *B23C 5/10* (2006.01)
  *C23C 14/02* (2006.01)
  *C23C 14/54* (2006.01)

(52) U.S. Cl.
  CPC ...... *C23C 14/0617* (2013.01); *C23C 14/0641* (2013.01); *C23C 14/54* (2013.01); *C23C 30/005* (2013.01); *B23C 2222/28* (2013.01); *B23C 2222/84* (2013.01); *B23C 2228/10* (2013.01); *B23C 2228/24* (2013.01)

(56) References Cited

U.S. PATENT DOCUMENTS

2009/0252973 A1* 10/2009 Cremer ............... C23C 14/0641
                                                          204/192.1
2015/0030401 A1* 1/2015 Senbokuya ......... C23C 14/0641
                                                          204/192.38

FOREIGN PATENT DOCUMENTS

| CN | 1820880 A | 8/2006 |
|---|---|---|
| JP | 2002-337007 * | 11/2002 |
| JP | 2004-256922 * | 9/2004 |
| JP | 3598074 B2 | 12/2004 |
| JP | 3669700 B2 | 7/2005 |
| JP | 2008-030158 * | 2/2008 |
| JP | 2008-296290 A | 12/2008 |
| JP | 2009-012139 A | 1/2009 |
| JP | 2009-220260 A | 10/2009 |
| JP | 2011-067883 A | 4/2011 |
| JP | 2011-218530 A | 11/2011 |
| JP | 2011-224670 A | 11/2011 |
| JP | 2012-024854 A | 2/2012 |
| JP | 2013-212574 A | 10/2013 |
| WO | 2012/102374 A1 | 8/2012 |

OTHER PUBLICATIONS

Office Action dated Jul. 18, 2016, issued for Chinese patent application No. 201480009840.2 and English translation thereof.
Supplementary European Search Report dated Oct. 5, 2016, issued for the European patent application No. 14769360.0.

* cited by examiner

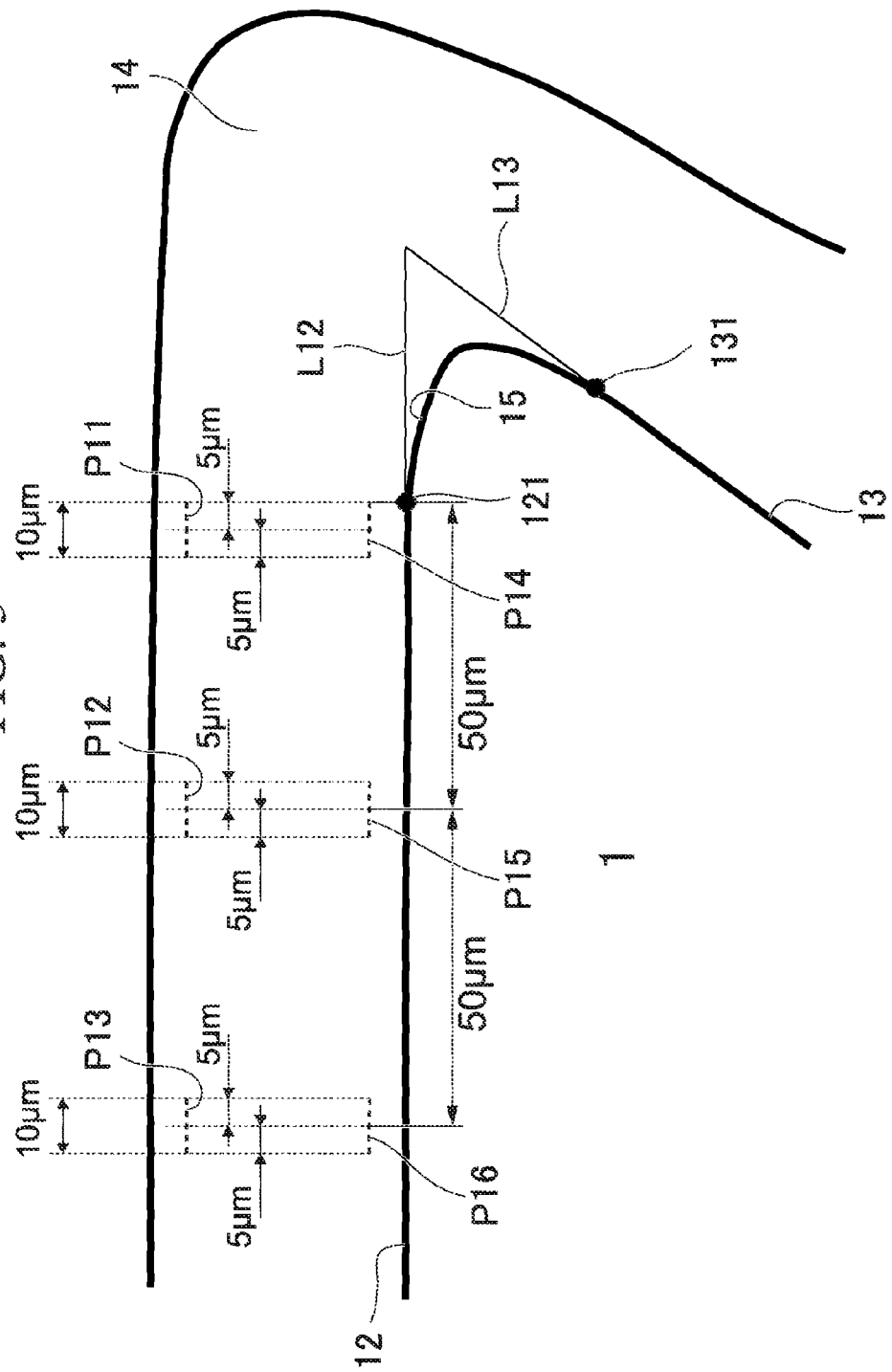

SURFACE-COATED CUTTING TOOL

TECHNICAL FIELD

The invention relates to a surface-coated cutting tool (hereinafter, referred to as a coated tool) having a hard coating layer that exhibits excellent wear resistance during cutting of high hardness steel such as hardened steel.

Priority is claimed on Japanese Patent Application No. 2013-061011, filed Mar. 22, 2013, Japanese Patent Application No. 2013-061010, filed Mar. 22, 2013, Japanese Patent Application No. 2013-154110, filed Jul. 25, 2013, and Japanese Patent Application No. 2013-154111, filed Jul. 25, 2013, the contents of which are incorporated herein by reference.

BACKGROUND ART

In general, as coated tools, there are inserts which are detachably attached to the tip portion of an insert holder used for turning or plaining of a work material, such as various types of steels and cast iron, drills used for drilling or the like of the work material, and solid type end mills used for facing, grooving, shoulder milling, and the like of the work material. In addition, as coated tools, indexable end mills and the like are also known which include inserts detachably attached thereto and perform cutting in the same manner as the solid type end mills.

For example, as described in PTL 1, as a coated tool, a coated tool is known in which a hard coating layer including a layer made of complex nitride of Al, Cr, and B (hereinafter, referred to as (Al, Cr, B)N) is vapor-deposited on the surface of a body (hereinafter, referred to as a tool body) made of tungsten carbide (hereinafter, referred to as WC)-based cemented carbide. Regarding the conventional coated tool, it is known that the (Al, Cr, B)N layer forming the hard coating layer is excellent in adhesion, high-temperature oxidation resistance, and wear resistance and thus exhibits excellent cutting performance.

In addition, regarding the conventional coated tool, it is known that coatings are formed by an ion plating method or a sputtering method. For example, regarding the coating formation using arc ion plating, a method using an arc ion plating apparatus 100 as shown in FIGS. 1A and 1B is known. The arc ion plating apparatus 100 includes: a rotating table 101 on which tool bodies (cemented carbide bodies) 1 are placed; a heater 102 for heating the tool bodies 1, a reaction gas inlet 103 for introducing a reaction gas; a gas outlet 104 for discharging the gas to the outside of the system; two anode electrodes 111 and 112; and two cathode electrodes 113 and 114. The anode electrode 111 and the cathode electrode 113 are connected to an arc power supply 115 provided outside the apparatus 100, the anode electrode 112 and the cathode electrode 114 are connected to an arc power supply 116 provided outside the apparatus 100, and the rotating table 101 is connected to a bias power supply 117 provided outside the apparatus 100. The tool bodies (cemented carbide bodies) 1 are mounted on the rotating table 101 in the arc ion plating apparatus 100, the tool bodies 1 are heated to a temperature of 500° C. by the heater 102, nitrogen gas as the reaction gas is introduced into the apparatus 100 through the reaction gas inlet 103 to form a reaction atmosphere at 2 Pa, and a bias voltage of −100 V is applied to the tool bodies 1 from the bias power supply 117. It is also known that under such conditions, a current of 90 A is supplied by the arc power supply 115 to between the anode electrode 111 and the cathode electrode 113 in which an Al—Cr—B alloy (Al—Cr—B alloy target) with a predetermined composition is set, so as to generate arc discharge such that the (Al, Cr, B)N is vapor-deposited on the surface of the tool bodies 1 and thus a coated tool can be produced.

In addition, as described in PTL 2, as a coated tool, a coated tool is known in which a hard coating layer including a layer made of complex nitride of Al, Cr, and Si is vapor-deposited on the surface of a body (hereinafter, referred to as a tool body) made of tungsten carbide (hereinafter, referred to as WC)-based cemented carbide. Regarding the conventional coated tool, it is known that the layer made of complex nitride of Al, Cr, and Si forming the hard coating layer is excellent in adhesion, high-temperature oxidation resistance, and wear resistance and thus exhibits excellent cutting performance.

In addition, regarding the conventional coated tool, it is known that coatings are formed by an ion plating method or a sputtering method. For example, regarding the coating formation using arc ion plating, a method using an arc ion plating apparatus 200 as shown in FIGS. 4A and 4B is known. The arc ion plating apparatus 200 includes: a rotating table 201 on which tool bodies (cemented carbide bodies) 2 are placed; a heater 202 for heating the tool bodies 2; a reaction gas inlet 203 for introducing a reaction gas, a gas outlet 204 for discharging the gas to the outside of the system; two anode electrodes 211 and 212; and two cathode electrodes 213 and 214. The anode electrode 211 and the cathode electrode 213 are connected to an arc power supply 215 provided outside the apparatus 200, the anode electrode 212 and the cathode electrode 214 are connected to an arc power supply 216 provided outside the apparatus 200, and the rotating table 201 is connected to a bias power supply 217 provided outside the apparatus 200. The tool bodies (cemented carbide bodies) 2 are mounted on the rotating table 201 in the arc ion plating apparatus 200, the tool bodies 2 are heated to a temperature of 500° C. by the heater 202, nitrogen gas as the reaction gas is introduced into the apparatus 200 through the reaction gas inlet 203 to form a reaction atmosphere at 2 Pa, and a bias voltage of −100 V is applied to the tool bodies 2 from the bias power supply 217. It is also known that under such conditions, a current of 90 A is supplied by the arc power supply 215 to between anode electrode 211 and the cathode electrode 213 in which an Al—Cr—Si alloy (Al—Cr—Si alloy target) with a predetermined composition is set, so as to generate arc discharge such that the complex nitride of Al, Cr, and Si is vapor-deposited on the surface of the tool bodies 2 and thus a coated tool can be produced.

However, regarding the coated tool, in order to further improve cutting performance, particularly chipping resistance, wear resistance, and the like, various suggestions on the structure of the hard coating layer have been made.

For example, in PTL 3, as a coated tool improved in fracturing resistance by suppressing the fracturing of the coating layer on the rake face, and also improved in wear resistance of the flank face, the following coated tool (end mill) is described. That is, a coated tool (end mill) is described in which the coating layer is formed of columnar crystal grains, the thickness of the coating layer on the rake face is smaller than that on the flank face, the coating layer is formed of two layer regions including a lower layer region formed on the coating layer body side and an upper layer region which has a greater average grain width than that of the lower layer region and is formed on the surface side of the coating layer, the ratio of the thickness of the upper layer region to the thickness of the coating layer on the rake face is less than the ratio of the thickness of the upper layer region to the thickness of the coating layer on the flank face, and the average grain width of the columnar crystal grains on the rake face is smaller than the average grain width of the columnar crystal grains on the flank face.

In addition, for example, in PTL 4, as a coated tool with a coating compatibly satisfying wear resistance and toughness and having excellent adhesion to a base material, the following coated tool is described. That is, a coated tool is described in which the coating formed on the base material includes a first coating layer, the first coating layer includes a fine structure region and a coarse structure region, the compound forming the fine structure region has an average grain size of 10 nm to 200 nm, the fine structure region exists in a range from the surface side of the first coating layer to a thickness of 50% or greater with respect to the thickness of the entire first coating layer, and has an average compressive stress in a range of −4 GPa to −2 GPa, the first coating layer has a stress distribution in the thickness direction thereof, and has two or more maximum or minimum values in the stress distribution, and the maximum or minimum values located closer to the surface side in the thickness direction have higher compressive stress.

CITATION LIST

Patent Literature

[PTL 1] Japanese Patent No. 3669700
[PTL 2] Japanese Patent No. 3598074
[PTL 3] Japanese Unexamined Patent Application, First Publication No. 2008-296290
[PTL 4] Japanese Unexamined Patent Application, First Publication No. 2011-67883

SUMMARY OF INVENTION

Technical Problem

In recent years, the performance of machine tools has been remarkably enhanced, and there has been a strong demand for power saving and energy saving during cutting, and a further reduction in cost. In accordance with this, cutting is performed under harder cutting conditions.

In the conventional coated tool, a certain degree of improvement in chipping resistance, fracturing resistance, and wear resistance can be achieved. However, in a case where the coated tool is used in a hard cutting operation of high hardness steel such as hardened steel, abnormal damage such as chipping is likely to occur and wear is significant. As a result, in the current situation, the coated tool reaches the tool life within a relatively short time.

The present invention has been made taking the foregoing circumstances into consideration, and an object thereof is to provide a surface-coated cutting tool which has excellent wear resistance without the occurrence of abnormal damage even during cutting of high hardness steel such as hardened steel, and thus exhibits excellent cutting performance during use over a long period of time.

Solution to Problem

In order to accomplish the object, the inventors intensively studied the crystal grain structure of a hard coating layer, and as a result, obtained the following knowledge.

Hitherto, when a coated tool is produced, as means for forming the hard coating layer, a CVD method, a PVD method, and the like are generally employed. For example, when a hard coating layer made of (Al, Cr, B)N is formed by an arc ion plating method (hereinafter, referred to as an AIP method) which is a type of PVD method, a tool body is loaded on an apparatus, and a predetermined bias voltage is applied thereto. In addition, the inside of the apparatus is heated to a predetermined temperature. In this state, arc discharge is generated between an anode electrode and an Al—Cr—B alloy target with a predetermined composition, and, at the same time, nitrogen gas as a reaction gas is introduced into the apparatus to perform the vapor-deposition in a reaction atmosphere at a predetermined pressure. Thereby, the hard coating layer is formed (see FIGS. 1A and 1B).

The inventors had inspected and examined an effect of a magnetic field on the structure of the hard coating layer by applying a magnetic field between the tool body and the target when the hard coating layer made of (Al, Cr, B)N is formed by the conventional AIP method. As a result, the inventors found that the grain size of granular crystal grains constituting the hard coating layer can be adjusted by forming the hard coating layer according to the AIP method in a magnetic field with a predetermined intensity. In addition, a coated tool having the hard coating layer made of (Al, Cr, B)N, in which the grain size of the hard coating layer is optimized in this manner, exhibits excellent chipping resistance and wear resistance during cutting of high hardness steel such as hardened steel and exhibits excellent cutting performance during use over a long period of time.

A first aspect of the present invention has been made on the basis of the findings and is a surface-coated cutting tool having the following features.

A surface-coated cutting tool including: a hard coating layer which is vapor-deposited on a surface of a tool body made of tungsten carbide-based cemented carbide and has an average thickness of 2 μm to 10 μm, in which (a) the hard coating layer comprises a layer made of complex nitride of Al, Cr, and B in which a ratio (atomic ratio) of the amount of Cr is 0.2 to 0.45 and a ratio (atomic ratio) of the amount of B is 0.01 to 0.1 to the total amount of Al, Cr, and B, and (b) in an area within 100 μm from an edge tip on a flank face of the surface-coated cutting tool, the hard coating layer has a granular crystal grain structure, the average grain size of granular crystal grains is 0.1 μm to 0.4 μm on the surface of the hard coating layer, the average grain size of granular crystal grains on the boundary surface between the tool body and the hard coating layer is 0.02 μm to 0.1 μm smaller than that on the surface of the hard coating layer, and a grain size length ratio of crystal grains having a grain size of 0.1 μm or less is 20% or less.

In addition, hitherto, when a coated tool is produced, as means for forming the hard coating layer, a CVD method, a PVD method, and the like are generally employed. For example, when a hard coating layer made of complex nitride of Al, Cr, and Si (hereinafter, referred to as (Al, Cr, Si)N) is formed by an arc ion plating method (hereinafter, referred to as an AIP method) which is a type of PVD method, a tool body is loaded on an apparatus, and a predetermined bias voltage is applied thereto. In addition, in a state where the inside of the apparatus is heated to a predetermined temperature, arc discharge is generated between an anode electrode and an Al—Cr—Si alloy target with a predetermined composition, and, at the same time, nitrogen gas as a reaction gas is introduced into the apparatus to perform the vapor-deposition in a reaction atmosphere at a predetermined pressure. Thereby, the hard coating layer is formed (see FIGS. 4A and 4B).

The inventors had inspected and examined an effect of a magnetic field on the structure of the hard coating layer by applying a magnetic field between the tool body and the target when the hard coating layer made of (Al, Cr, Si)N is formed by the conventional AIP method. As a result, the inventors found that the grain size of granular crystal grains constituting the hard coating layer can be adjusted by forming the hard coating layer according to the AIP method in a magnetic field with a predetermined intensity. In addition, a coated tool having the hard coating layer made of (Al, Cr, Si)N, in which the grain size of the hard coating layer is optimized in this manner, exhibits excellent chipping resistance and wear resistance during cutting of high hardness steel such as hardened steel and exhibits excellent cutting performance during use over a long period of time.

A second aspect of the present invention has been made on the basis of the findings and is a surface-coated cutting tool having the following features.

A surface-coated cutting tool including: a hard coating layer which is vapor-deposited on a surface of a tool body made of tungsten carbide-based cemented carbide and has an average thickness of 2 μm to 10 μm, in which (a) the hard coating layer comprises a layer made of complex nitride of Al, Cr, and Si in which a ratio (atomic ratio) of the amount of Cr is 0.2 to 0.45 and a ratio (atomic ratio) of the amount of Si is 0.01 to 0.15 to the total amount of Al, Cr, and Si, and (b) in an area within 100 μm from an edge tip on a flank face of the surface-coated cutting tool, the hard coating layer has a granular crystal grain structure, the average grain size of granular crystal grains is 0.1 μm to 0.4 μm on the surface of the hard coating layer, the average grain size of granular crystal grains on the boundary surface between the tool body and the hard coating layer is 0.02 μm to 0.1 μm smaller than that on the surface of the hard coating layer, and a grain size length ratio of crystal grains having a grain size of 0.1 μm or less is 20% or less.

According to the first and second aspects of the present invention, it is preferable that in an area within 100 μm from an edge tip on a flank face of the surface-coated cutting tool, the average aspect ratio of the crystal grains be 1 to 6.

A third aspect of the present invention is a method for producing a surface-coated cutting tool having the following features.

A method for producing a surface-coated cutting tool having a hard coating layer which is vapor-deposited on a surface of a tool body made of tungsten carbide-based cemented carbide, in which the hard coating layer includes a layer made of complex nitride of Al Cr, and B in which a ratio (atomic ratio) of the amount of Cr is 0.2 to 0.45 and a ratio (atomic ratio) of the amount of B is 0.01 to 0.1 to the total amount of Al, Cr, and B, the method including vapor-depositing the hard coating layer on the surface of the tool body, while maintaining the temperature of the tool body in 370° C. to 450° C., rotating and revolving the tool body, and applying a magnetic field set so that the integrated magnetic force is 40 mT×mm to 150 mT×mm between the Al—Cr—B alloy target and the tool body.

A fourth aspect of the present invention is a method for producing a surface-coated cutting tool having the following features.

A method for producing a surface-coated cutting tool having a hard coating layer which is vapor-deposited on a surface of a tool body made of tungsten carbide-based cemented carbide, in which the hard coating layer includes a layer made of complex nitride of Al, Cr, and Si in which a ratio (atomic ratio) of the amount of Cr is 0.2 to 0.45 and a ratio (atomic ratio) of the amount of Si is 0.01 to 0.15 to the total amount of Al, Cr, and Si, the method including vapor-depositing the hard coating layer on the surface of the tool body, while maintaining the temperature of the tool body in 370° C. to 450° C., rotating and revolving the tool body, and applying a magnetic field set so that the integrated magnetic force is 40 mT×mm to 150 mT×mm between the Al—Cr—Si alloy target and the tool body.

According to the third and fourth aspects of the present invention, it is preferable that the hard coating layer be vapor-deposited on the surface of the tool body, while applying a bias voltage to the tool body.

According to the third and fourth aspects of the present invention, it is preferable that before the hard coating layer is vapor-deposited on the surface of the tool body, the surface of the tool body be subjected to bombardment cleaning by generating arc discharge between a Ti electrode and an anode electrode while applying bias voltage to the tool body.

Advantageous Effects of Invention

In the coated tool of the first aspect of the present invention, the hard coating layer including the (Al, Cr, B)N layer with a predetermined composition has a granular crystal grain structure in the area between the edge tip and 100 μm therefrom. Moreover, the surface grain size is 0.1 μm to 0.4 μm, the boundary surface grain size is 0.02 μm to 0.1 μm smaller than that of the surface grain size, and the grain size length ratio of crystal grains having a grain size of 0.1 μm or less is 20% or less in the area between the edge tip and 100 μm therefrom on the flank face. In this configuration, the coated tool of the first aspect exhibits excellent chipping resistance and wear resistance during cutting of high hardness steel such as hardened steel and exhibits excellent cutting performance during use over a long period of time.

In the coated tool of the second aspect of the present invention, the hard coating layer including the (Al, Cr, Si)N layer with a predetermined composition has a granular crystal grain structure in the area between the edge tip and 100 μm therefrom. Moreover, the surface grain size is 0.1 μm to 0.4 μm, the boundary surface grain size is 0.02 μm to 0.1 μm smaller than that of the surface grain size, and the grain size length ratio of crystal grains having a grain size of 0.1 μm or less is 20% or less in the area between the edge tip and 100 μm therefrom on the flank face. In this configuration, the coated tool of the second aspect exhibits excellent chipping resistance and wear resistance during cutting of high hardness steel such as hardened steel and exhibits excellent cutting performance during use over a long period of time.

BRIEF DESCRIPTION OF DRAWINGS

FIG. 3 is a schematic explanatory view of the longitudinal section of the coated tool according to the first embodiment.

DESCRIPTION OF EMBODIMENTS

First Embodiment

Figure 1A:
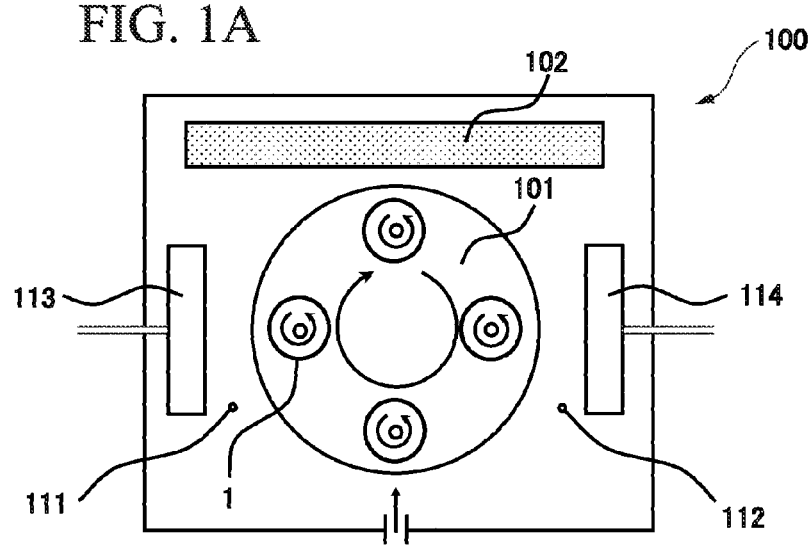
FIG. 1A is a plan view of a schematic explanatory view of a conventional AIP apparatus.

Next, a coated tool according to a first embodiment of the present invention will be described in detail.

Type and Average Thickness of Hard Coating Layer

A hard coating layer according to this embodiment includes a layer made of complex nitride of Al, Cr, and B ((Al, Cr, B)N layer).

An Al component has an effect of improving high-temperature hardness and heat resistance. A Cr component has an effect of improving high-temperature strength. Coexistence of contained Cr and Al has an effect of improving high-temperature oxidation resistance. In addition, a B component has an effect of improving the wear resistance of the hard coating layer and reducing the reactivity of a work material. With these effects, the (Al, Cr, B)N layer is already well-known as a hard coating layer having excellent high-temperature hardness, heat resistance, and high-temperature strength.

In this embodiment, the ratio (atomic ratio) of the amount of Cr is 0.2 to 0.45 and the ratio (atomic ratio) of the amount of B is 0.01 to 0.1 to the total amount of Al, Cr, and B. When the ratio (atomic ratio) of the amount of Cr is less than 0.2, the ratio of a hexagonal crystal structure increases, and thus hardness is reduced. On the other hand, when the ratio of the amount of Cr exceeds 0.45, the ratio of the amount of Al is relatively low, resulting in a reduction in heat resistance. As a result, due to the occurrence of uneven wear, thermal plastic deformation, and the like, wear resistance is deteriorated. Therefore, the ratio (atomic ratio) of the amount of Cr to the total amount of Al, Cr, and B needs to be 0.2 to 0.45.

In addition, when the ratio of the amount of B to the total amount of Al, Cr, and B is less than 0.01, enhancement of wear resistance cannot be expected. On the other hand, when the ratio of the amount of B exceeds 0.1, precipitates with low toughness may be formed in the layer and the base material tends to become embrittled. Therefore, the ratio (atomic ratio) of the amount of B needs to be 0.01 to 0.1.

Furthermore, when the average thickness of the hard coating layer which includes the (Al, Cr, B)N layer is smaller than 2 μm, excellent wear resistance cannot be exhibited over a long period of time, and this causes a reduction in the tool life. On the other hand, when the average thickness thereof exceeds 10 μm, the coating is likely to self-destruct. Therefore, the average thickness thereof needs to be 2 μm to 10 μm.

Layer Structure of Hard Coating Layer Including (Al, Cr B)N Layer:

In this embodiment, the hard coating layer including the (Al, Cr, B)N layer is formed of granular crystal grains. Furthermore, the average grain size of crystal grains on the surface of the hard coating layer (hereinafter, simply referred to as "surface grain size") is 0.1 μm to 0.4 μm. In addition, the coating is formed so that the average grain size of crystal grains of the hard coating layer on the boundary surface between the tool body and the hard coating layer (hereinafter, simply referred to as "boundary surface grain size") is 0.02 μm to 0.1 μm smaller than the surface grain size. Thereby, the hard coating layer having a crystal grain structure in which the surface grain size and the boundary surface grain size are different from each other, is formed.

Here, the "crystal grains of the hard coating layer on the boundary surface between the tool body and the hard coating layer" means crystal grains formed in an internal region of the hard coating layer with a thickness of 0.5 μm from the boundary surface between the tool body and the hard coating layer inside the hard coating layer, and the "crystal grains on the surface of the hard coating layer" means crystal grains formed in a region with a depth of 0.5 μm from the surface of the hard coating layer.

In addition, "granular crystal grains" mentioned here means crystal grains having an aspect ratio of 1 to 6. The aspect ratio is obtained by calculating the ratio between the longest diameter (major axis) in a cross-section of a crystal grain perpendicular to the surface (flank face) of the tool body and the longest diameter (minor axis) among the diameters perpendicular to the major axis, using the major axis and the minor axis as the numerator and the denominator, respectively.

The average grain size will be described in detail as follows.

When the average grain size (surface grain size) of crystal grains on the surface of the hard coating layer is less than 0.1 μm, the number of grain boundaries included in the layer is increased, and thus fracture is likely to occur in grain boundaries which are relatively brittler than intragranular portions during cutting. As a result, wear resistance is deteriorated. On the other hand, when the surface grain size thereof exceeds 0.4 μm, the number of grain boundaries included in the layer is small, and thus a load is likely to be locally applied to crystal grain boundaries during cutting. Therefore, in a case where cracks are initiated, the cracks easily propagate, and thus chipping resistance is deteriorated. Therefore, wear resistance or chipping resistance cannot be sufficiently exhibited during cutting in use over a long period of time. Accordingly, the surface grain size thereof is determined as 0.1 μm to 0.4 μm.

The average grain size of crystal grains of the hard coating layer on the boundary surface between the tool body and the hard coating layer (boundary surface grain size) needs to have a value of 0.02 μm to 0.1 μm smaller than the surface grain size. The technical reason is that, in a case where the boundary surface grain size is smaller than the surface grain size by a difference of greater than 0.1 μm, due to the difference in the average grain size and the difference in the wear resistance between the surface region and the boundary surface region of the hard coating layer, wear and chipping are likely to occur during cutting, and thus cutting performance is deteriorated.

On the other hand, in a case where the difference between the boundary surface grain size and the surface grain size is smaller than 0.02 μm, the average grain sizes of the surface and the boundary surface are equal to each other and thus the levels of wear resistance thereof are equal to each other. Therefore, during cutting, the effect of improving the wear resistance described above cannot be applied.

In this embodiment, since the boundary surface grain size is set to a value of 0.02 μm to 0.1 μm smaller than the surface grain size, it is possible to compatibly increase the effect of improving the wear resistance of the surface of the hard coating layer during cutting and the effect of improving the chipping resistance of the boundary surface region. As a result, wear resistance or chipping resistance can be sufficiently exhibited during use over a long period of time.

A method for measuring the grain size is described below.

A cross-section on the flank face side is cut from the edge tip of the tool body, and the cross-section is observed by a scanning electron microscope (SEM). The cross-section is a face perpendicular to a flank face 12 of the tool body 1 as shown in FIG. 3. A straight line which is parallel to the flank face 12 is drawn on each crystal grain formed in a region with a depth of 0.5 μm from the surface of a hard coating layer 14 on the flank face 12, and the distance between the intersections of the straight line and the crystal grain boundary is defined as the grain size. Here, the position at which the straight line is drawn to be parallel to the flank face 12 is a position at which the grain size of each crystal grain is the largest. Grain sizes are measured in an area within 100 μm from an edge tip 121 on the flank face 12, and the average value of the grain sizes is determined as the surface grain size. More specifically, the grain sizes of crystal grains in an area with a width of 10 μm are measured at each of three positions including a position P11 immediately above the edge tip 121 on the flank face 12, a position P12 distant from the edge tip 121 on the flank face 12 by 50 μm, and a position P13 distant from the edge tip 121 by 100 μm, and the average value of all of the grain sizes at the three positions is determined as the surface grain size. In addition, regarding each crystal grain formed in a region with a thickness of 0.5 μm from the boundary surface between the tool body 1 (the flank face 12) and the hard coating layer 14 in the hard coating layer 14, the boundary surface grain size is calculated in the same manner.

In addition, in the area between the edge tip 121 and 100 μm therefrom on the flank face 12 (specifically, the three positions including the position P11 immediately above the edge tip on the flank face, the position P12 distant from the edge tip on the flank face by 50 μm, and the position P13 distant from the edge tip by 100 μm, to be measured), regarding any of the surface grain size and the boundary surface grain size, the grain size length ratio of crystal grains with a grain size of 0.1 μm or less needs to be 20% or less. In a case where fine crystal grains with a grain size of 0.1 μm or less are formed in a proportion of higher than 20%, the number of crystal grain boundaries included in the layer is increased. Therefore, fracture is likely to occur in grain boundaries which are relatively brittler than intragranular portions during cutting and wear resistance is deteriorated.

Here, the "a grain size length ratio of crystal grains having a grain size of 0.1 μm or less" represents, when the grain sizes of a plurality of crystal grains are measured, the ratio of the sum of the grain sizes of crystal grains having a grain size of 0.1 μm or less to the sum of all of the measured grain sizes.

As shown in FIG. 3, after measuring each grain size of the crystal grains in the dotted line portions (P11 to P16), the surface grain size, the boundary surface grain size, and the grain size length ratio of crystal grains having a grain size of 0.1 μm or less are calculated. The width of each of the dotted line portions is 10 μm. In addition, as shown in FIG. 3, in the present invention, the "edge tip" is defined as the "point that is closest to the tip while still on the straight line-shaped cutting edge which excludes a conical (curved) portion of a corner portion 15 of the tip of the cutting edge of the tool body 1." That is, the edge tip 121 of the flank face 12 is an inflection point between the straight line-shaped portion and the curved portion of the flank face 12 and is also a contact point between an extension line L12 extending from the straight-line portion of the flank face 12 and the corner portion on the observation surface of the SEM. Here, reference numerals 13, 131, and L13 in FIG. 3 respectively denote a rake face, the edge tip of the rake face, and an extension line from the straight-line portion of the rake face.

Figure 1B:
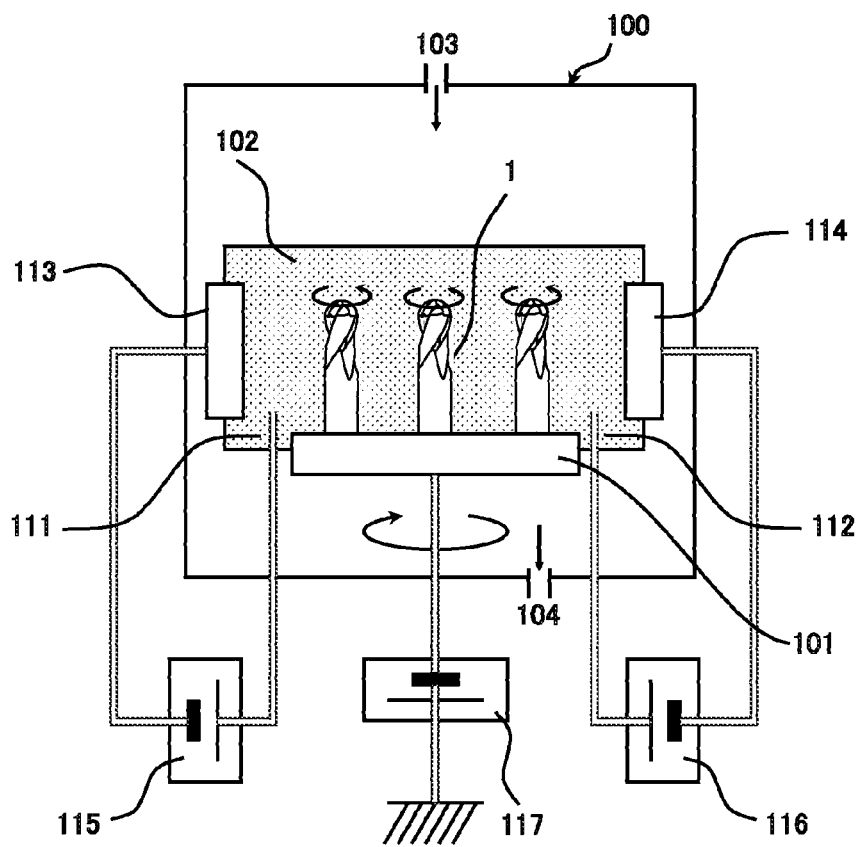
FIG. 1B is a side view of the schematic explanatory view of the conventional AIP apparatus.
Figure 2A:
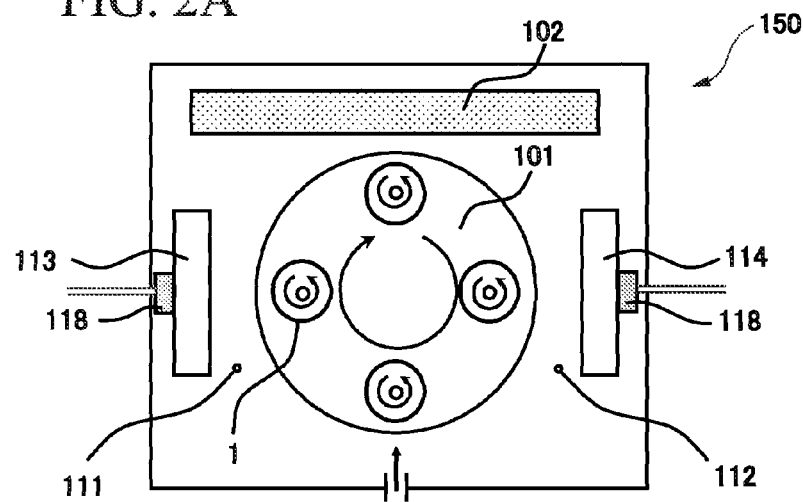
FIG. 2A is a plan view of a schematic explanatory view of an AIP apparatus for producing a coated tool according to a first embodiment.
Figure 2B:
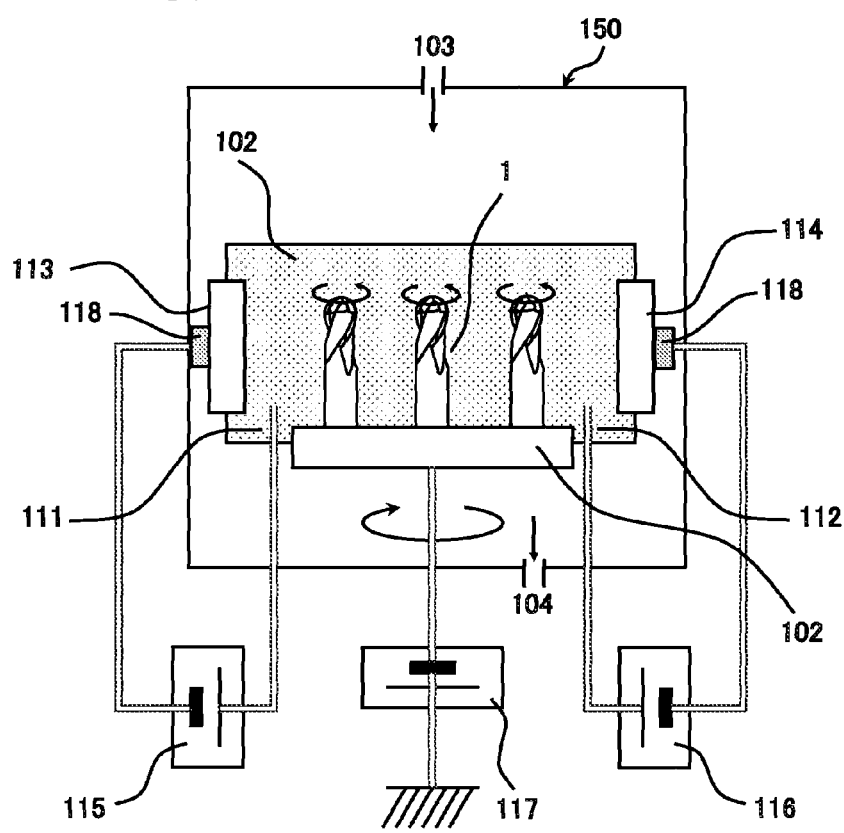
FIG. 2B is a side view of the schematic explanatory view of the AIP apparatus for producing the coated tool according to the first embodiment.

Vapor-Deposition of Hard Coating Layer:

The hard coating layer 14 of this embodiment is vapor-deposited on the tool body 1 using an arc ion plating apparatus (AIP apparatus) 150 as shown in FIGS. 2A and 2B. In FIGS. 2A and 2B, like elements which are common to or have the same functions as those in FIGS. 1A and 1B are denoted by like reference numerals. The tool body 1 is rotated and revolved in the AIP apparatus 150 while maintaining the temperature of the tool body 1 in 370° C. to 450° C., and the hard coating layer 14 is vapor-deposited while applying a predetermined magnetic field between the center of the surface of a target and the tool body 1 which is nearest to the target (the integrated magnetic force is 40 mT×mm to 150 mT×mm), thereby forming the hard coating layer 14.

For example, a cathode electrode 114 made of a Ti electrode for body cleaning is provided on one side of the inside of the AIP apparatus 150, and a target (cathode electrode) 113 made of an Al—Cr—B alloy is provided on the other side thereof. That is, the cathode electrodes 113 and 114 are disposed so as to face each other across the rotating table 101.

First, the tool bodies 1 made of tungsten carbide (WC)-based cemented carbide are cleaned and dried, and are mounted on the rotating table 101 in the AIP apparatus 150. Arc discharge of 100 A is generated between the Ti electrode 114 for body cleaning and an anode electrode 112 in a vacuum by an arc power supply 116, and the surfaces of the tool bodies 1 are subjected to bombardment cleaning while applying a bias voltage of −1000 V to the tool bodies 1 by a bias power supply 117.

Thereafter, a magnetic field is applied so that the magnetic force integrated from the center of the surface of the Al—Cr—B alloy target 113 to the tool body 1 which is nearest to the target is 40 mT×mm to 150 mT×mm.

Next, nitrogen gas as a reaction gas is introduced into the apparatus 150 through a reaction gas inlet 103 so that an atmospheric pressure is 6 Pa inside the apparatus 150. While maintaining the temperature of the tool body 1 in 370° C. to 450° C., a bias voltage of −50 V is applied to the tool body 1 by the bias power supply 117 and arc discharge of 100 A is generated between the Al—Cr—B alloy target (cathode electrode) 113 and an anode electrode 111 by an arc power supply 115. While supporting the tool body 1 on the rotating table 101 so that a portion or the entirety of the flank face 12 and the surface of the target 113 become horizontal when the tool body 1 is nearest to the target 113, and while rotating and revolving the tool body 1 vapor-deposition is performed. In the above-described method, the hard coating layer including the (Al, Cr, B)N layer having the layer structure of this embodiment can be vapor-deposited.

In addition, in order to apply a magnetic field between the Al—Cr—B alloy target 113 and the tool body 1, for example, a magnetic field can be formed by arbitrary means such as installing an electromagnetic coil or a permanent magnet as a magnetic field generation source in the periphery of the cathode electrode 113, specifically, at a position denoted by reference numeral 118 of FIGS. 2A and 2B, or disposing a permanent magnet at the center portion of the inside of the AIP apparatus 150.

Here, the integrated magnetic force in this embodiment is calculated by the following calculation method.

Magnetic flux densities on the straight line from the center of the Al—Cr—B alloy target 113 to the position of the tool body 1 are measured at an interval of 10 mm by a magnetic flux density meter. The magnetic flux density is represented in terms of mT (millitesla), and the distance from the center of the surface of the target 113 to the position of the tool body 1 is represented in terms of mm (millimeter). Furthermore, in a case where a graph is plotted by using the distance from the center of the surface of the target 113 to the position of the tool body 1 as the horizontal axis and using the magnetic flux density as the vertical axis, a value corresponding to an area is defined as the integrated magnetic force (mT×mm).

Here, the position of the tool body 1 is a position where the tool body 1 is nearest to the Al—Cr—B alloy target. In addition, the measurement of the magnetic flux density need not be performed during discharge as long as a magnetic field is formed. For example, the magnetic flux density may be measured in a state where discharge does not occur under the atmospheric pressure. In addition, regarding the "center of the target" or the "center of the surface of the target", when the target is circular, the center of the circle is the center of the target, and when the target is rectangular, the intersection of the diagonals thereof is the center of the target.

Second Embodiment

Next, a coated tool according to a second embodiment of the present invention will be described in detail.
Type and Average Thickness of Hard Coating Layer:

A hard coating layer according to this embodiment includes a layer made of complex nitride of Al, Cr, and Si ((Al, Cr, Si)N layer).

An Al component has an effect of improving high-temperature hardness and heat resistance, a Cr component has an effect of improving high-temperature strength. Coexistence of contained Cr and Al has an effect of improving high-temperature oxidation resistance. In addition, a Si component has an effect of improving the plastic deformation resistance of the hard coating layer. With these effects, the (Al, Cr, Si)N layer is already well-known as a hard coating layer having excellent high-temperature hardness, heat resistance, and high-temperature strength.

In this embodiment, the ratio (atomic ratio) of the amount of Cr is 0.2 to 0.45 and the ratio (atomic ratio) of the amount of Si is 0.01 to 0.15 to the total amount of Al, Cr, and Si. When the ratio (atomic ratio) of the amount of Cr is less than 0.2, the ratio of a hexagonal crystal structure increases, and thus hardness is reduced. On the other hand, when the ratio of the amount of Cr exceeds 0.45, the ratio of the amount of Al is relatively low, resulting in a reduction in heat resistance. As a result, due to the occurrence of uneven wear, thermal plastic deformation, and the like, wear resistance is deteriorated. Therefore, the ratio (atomic ratio) of the amount of Cr to the total amount of Al, Cr, and Si needs to be 0.2 to 0.45.

In addition, when the ratio of the amount of Si to the total amount of Al, Cr, and Si is less than 0.01, enhancement of plastic deformation resistance cannot be expected. On the other hand, when the ratio of the amount of Si exceeds 0.15, the hardness of the layer is increased while there is a tendency toward embrittlement. Therefore, the ratio (atomic ratio) of the amount of Si needs to be 0.01 to 0.15.

Furthermore, when the average thickness of the hard coating layer which includes the (Al, Cr, Si)N layer is smaller than 2 μm, excellent wear resistance cannot be exhibited over a long period of time, and this causes a reduction in the tool life. On the other hand, when the average thickness thereof exceeds 10 μm, the coating is likely to self-destruct. Therefore, the average thickness thereof needs to be 2 μm to 10 μm.
Layer Structure of Hard Coating Layer Including (Al, Cr, Si)N Layer:

In this embodiment, the hard coating layer including the (Al Cr, Si)N layer is formed of granular crystal grains. Furthermore, the average grain size of crystal grains on the surface of the hard coating layer (hereinafter, simply referred to as "surface grain size") is 0.1 μm to 0.4 μm. In addition, the coating is formed so that the average grain size of crystal grains of the hard coating layer on the boundary surface between the tool body and the hard coating layer (hereinafter, simply referred to as "boundary surface grain size") is 0.02 μm to 0.1 μm smaller than the surface grain size. Thereby, the hard coating layer having a crystal grain structure in which the surface grain size and the boundary surface grain size are different from each other, is formed.

Here, the "crystal grains of the hard coating layer on the boundary surface between the tool body and the hard coating layer" means crystal grains formed in an internal region of the hard coating layer with a thickness of 0.5 μm from the boundary surface between the tool body and the hard coating layer inside the hard coating layer, and the "crystal grains on the surface of the hard coating layer" means crystal grains formed in a region with a depth of 0.5 μm from the surface of the hard coating layer.

In addition, "granular crystal grains" mentioned here means crystal grains having an aspect ratio of 1 to 6. The aspect ratio is obtained by calculating the ratio between the longest diameter (major axis) in a cross-section of a crystal grain perpendicular to the surface (flank face) of the tool body and the longest diameter (minor axis) among the diameters perpendicular to the major axis, using the major axis and the minor axis as the numerator and the denominator, respectively.

The average grain size will be described in detail as follows.

When the average grain size (surface grain size) of crystal grains on the surface of the hard coating layer is less than 0.1 μm, the number of grain boundaries included in the layer is increased, and thus fracture is likely to occur in grain boundaries which are relatively brittler than intragranular portions during cutting. As a result, wear resistance is deteriorated. On the other hand, when the surface grain size thereof exceeds 0.4 μm, the number of grain boundaries included in the layer is small, and thus a load is likely to be locally applied to crystal grain boundaries during cutting. Therefore, in a case where cracks are initiated, the cracks easily propagate, and thus chipping resistance is deteriorated. Therefore, wear resistance or chipping resistance cannot be sufficiently exhibited during cutting in use over a long period of time. Accordingly, the surface grain size thereof is determined as 0.1 μM to 0.4 μm.

The average grain size of crystal grains of the hard coating layer on the boundary surface between the tool body and the hard coating layer (boundary surface grain size) needs to have a value of 0.02 μm to 0.1 μm smaller than the surface grain size. The technical reason is that, in a case where the boundary surface grain size is smaller than the surface grain size by a difference of greater than 0.1 μm, due to the difference in the average grain size and the difference in the wear resistance between the surface region and the boundary surface region of the hard coating layer, wear and chipping are likely to occur during cutting, and thus cutting performance is deteriorated.

On the other hand, in a case where the difference between the boundary surface grain size and the surface grain size is smaller than 0.02 µm, the average grain sizes of the surface and the boundary surface are equal to each other and thus the levels of wear resistance thereof are equal to each other. Therefore, during cutting, the effect of improving the wear resistance described above cannot be applied.

In this embodiment, since the boundary surface grain size is set to a value of 0.02 µm to 0.1 µm smaller than the surface grain size, it is possible to compatibly increase the effect of improving the wear resistance of the surface of the hard coating layer during cutting and the effect of improving the chipping resistance of the boundary surface region. As a result, wear resistance or chipping resistance can be sufficiently exhibited during use over a long period of time.

A method for measuring the grain size is described below.

Figure 6:
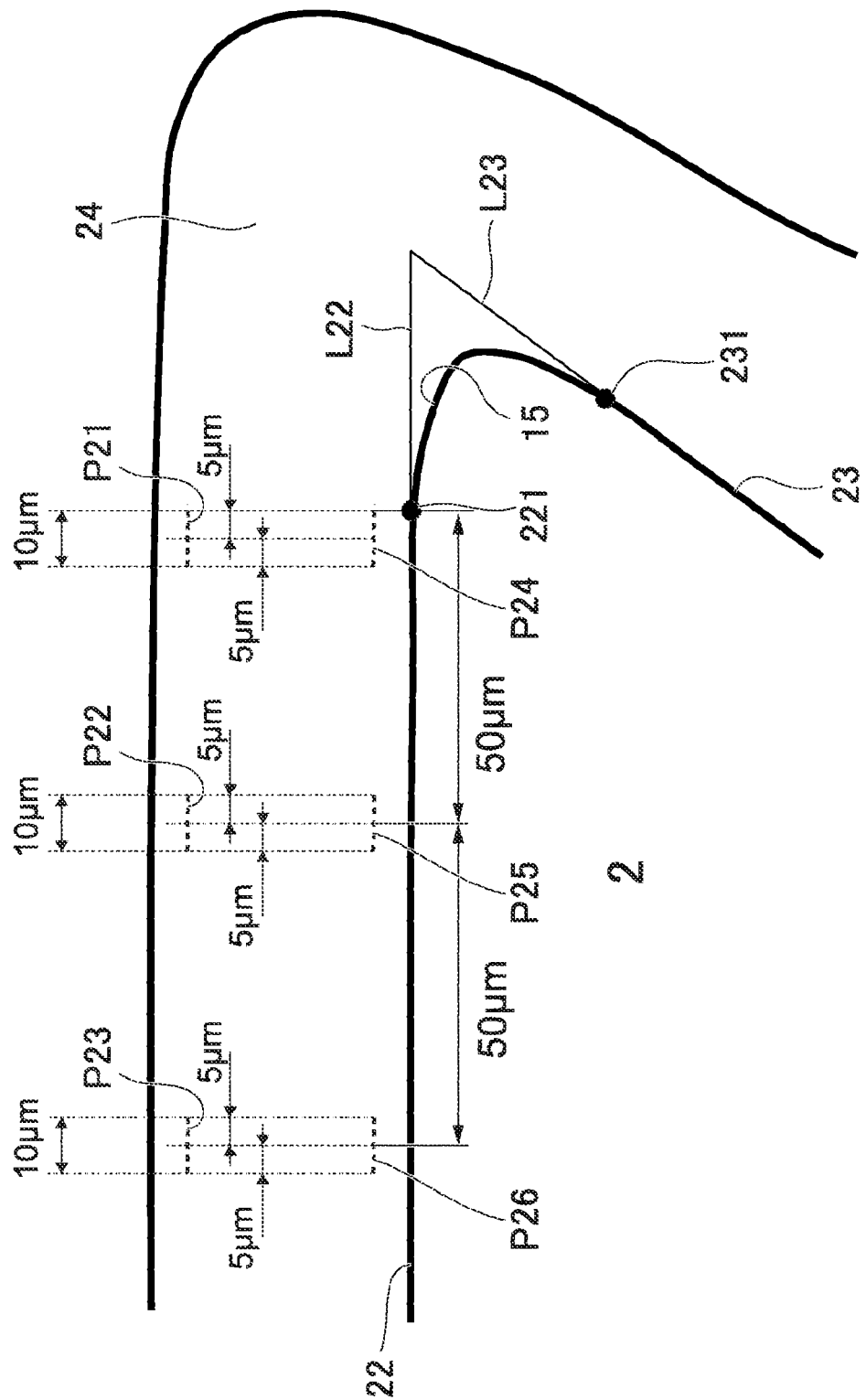
FIG. 6 is a schematic explanatory view of the longitudinal section of the coated tool according to the second embodiment.

A cross-section on the flank face side is cut from the edge tip of the tool body, and the cross-section is observed by an SEM. The cross-section is a face perpendicular to a flank face 22 of the tool body 2 as shown in FIG. 6. A straight line which is parallel to the flank face 22 is drawn on each crystal grain formed in a region with a depth of 0.5 µm from the surface of a hard coating layer 24 on the flank face 22, and the distance between the intersections of the straight line and the crystal grain boundary is defined as the grain size. Here, the position at which the straight line is drawn to be parallel to the flank face 22 is a position at which the grain size of each crystal grain is the largest. Grain sizes are measured in an area within 100 µm from an edge tip 221 on the flank face 22, and the average value of the grain sizes is determined as the surface grain size. More specifically, the grain sizes of crystal grains in an area with a width of 10 µm are measured at each of three positions including a position P21 immediately above the edge tip 221 on the flank face 22, a position P22 distant from the edge tip 221 on the flank face 22 by 50 µm, and a position P23 distant from the edge tip 221 by 100 µm, and the average value of all of the grain sizes at the three positions is determined as the surface grain size. In addition, regarding each crystal grain formed in a region with a thickness of 0.5 µm from the boundary surface between the tool body 2 (the flank face 22) and the hard coating layer 24 in the hard coating layer 24, the boundary surface grain size is calculated in the same manner.

In addition, in the area between the edge tip 221 and 100 µm therefrom on the flank face 22 (specifically, the three positions including the position P21 immediately above the edge tip 221 on the flank face, the position P22 distant from the edge tip on the flank face by 50 µm, and the position P23 distant from the edge tip by 100 µm, to be measured), regarding any of the surface grain size and the boundary surface grain size, the grain size length ratio of crystal grains with a grain size of 0.1 µm or less needs to be 20% or less. In a case where fine crystal grains with a grain size of 0.1 µm or less are formed in a proportion of higher than 20%, the number of crystal grain boundaries included in the layer is increased. Therefore, fracture is likely to occur in grain boundaries which are relatively brittler than intragranular portions during cutting and wear resistance is deteriorated.

Here, the "a grain size length ratio of crystal grains having a grain size of 0.1 µm or less" represents, when the grain sizes of a plurality of crystal grains are measured, the ratio of the sum of the grain sizes of crystal grains having a grain size of 0.1 µm or less to the sum of all of the measured grain sizes.

As shown in FIG. 6, after measuring each grain size of the crystal grains in the dotted line portions (P21 to P26), the surface grain size, the boundary surface grain size, and the grain size length ratio of crystal grains having a grain size of 0.1 µm or less are calculated. The width of each of the dotted line portions is 10 µm. In addition, as shown in FIG. 6, in the present invention, the "edge tip" is defined as the "point that is closest to the tip while still on the straight line-shaped cutting edge which excludes a conical (curved) portion of a corner portion 25 of the tip of the cutting edge of the tool body 2." That is, the edge tip 221 of the flank face 22 is an inflection point between the straight line-shaped portion and the curved portion of the flank face 22 and is also a contact point between an extension line L22 extending from the straight-line portion of the flank face 22 and the corner portion on the observation surface of the SEM. Here, reference numerals 23, 231, and L23 in FIG. 6 respectively denote a rake face, the edge tip of the rake face, and an extension line from the straight-line portion of the rake face.

Figure 4A:
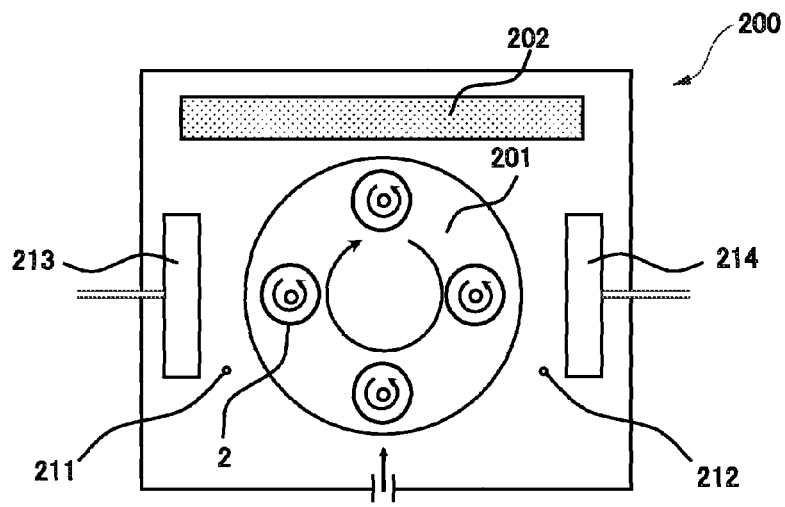
FIG. 4A is a plan view of a schematic explanatory view of a conventional AIP apparatus.
Figure 4B:
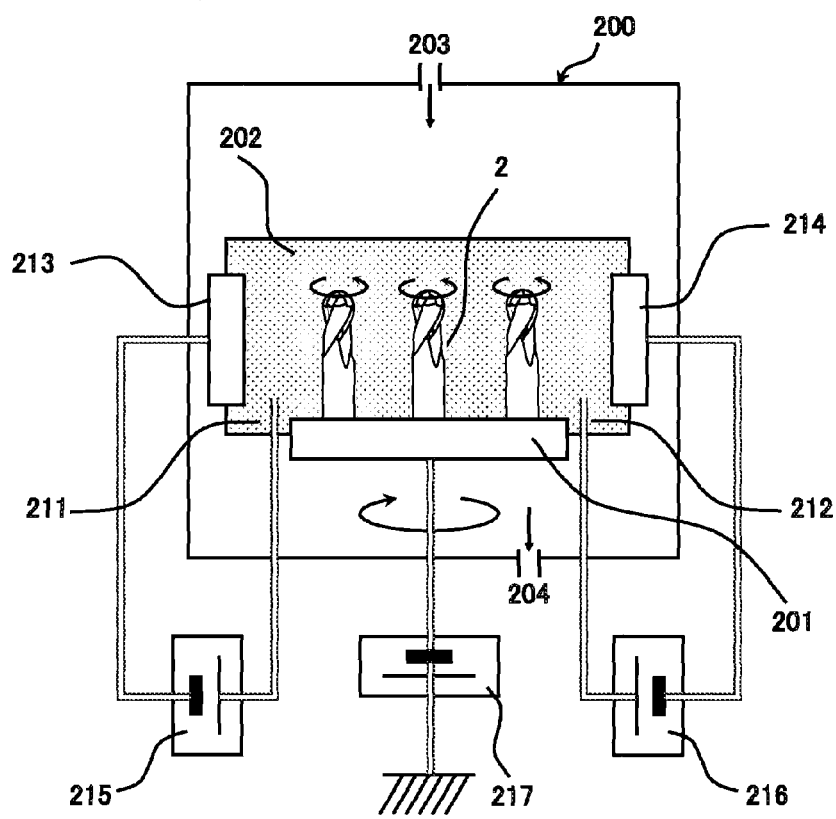
FIG. 4B is a side view of the schematic explanatory view of the conventional AIP apparatus.
Figure 5A:
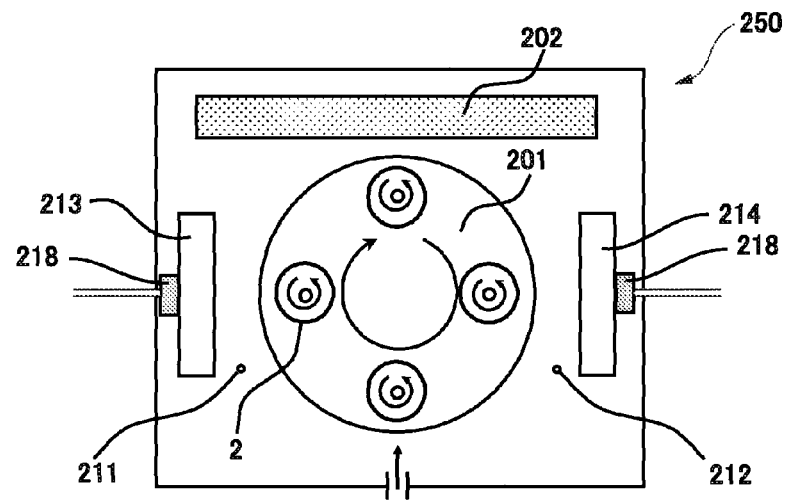
FIG. 5A is a plan view of the schematic explanatory view of an AIP apparatus for producing a coated tool according to a second embodiment.
Figure 5B:
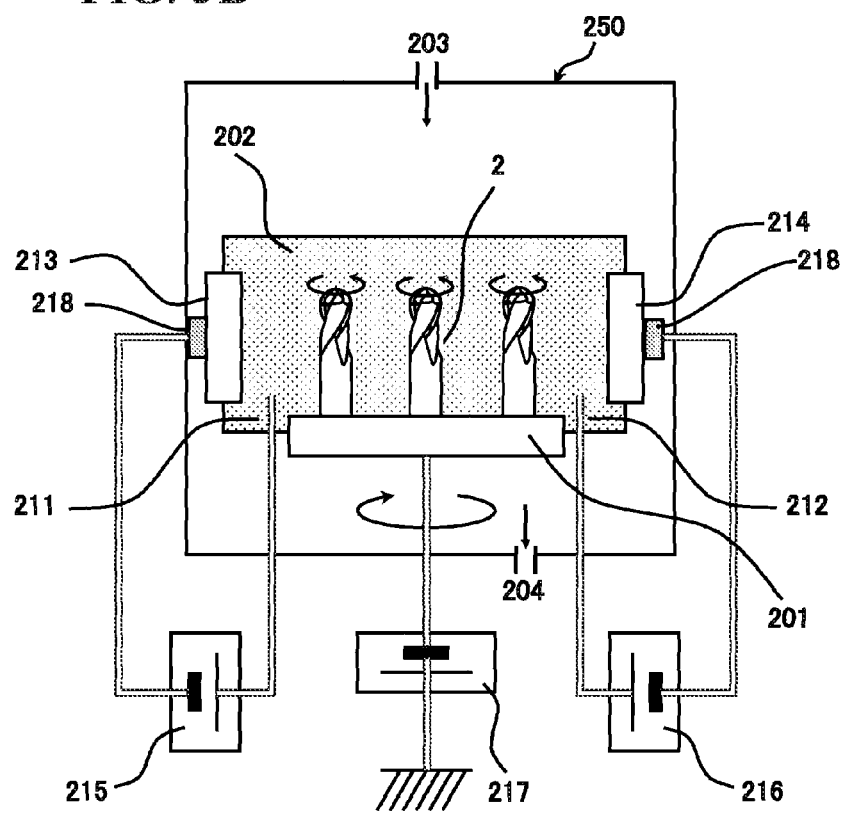
FIG. 5B is a side view of the schematic explanatory view of the AIP apparatus for producing the coated tool according to the second embodiment.

Vapor-Deposition of Hard Coating Layer:

The hard coating layer 24 of this embodiment is vapor-deposited on the tool body 2 using an arc ion plating apparatus (AIP apparatus) 250 as shown in FIGS. 5A and 5B. In FIGS. 5A and 5B, like elements which are common to or have the same functions as those in FIGS. 4A and 4B are denoted by like reference numerals. The tool body 2 is rotated and revolved in the AIP apparatus 250 while maintaining the temperature of the tool body 2 in 370° C. to 450° C., and the hard coating layer 24 is vapor-deposited while applying a predetermined magnetic field between the center of the surface of a target and the tool body 2 which is nearest to the target (the integrated magnetic force is 40 mT×mm to 150 mT×mm), thereby forming the hard coating layer 24.

For example, a cathode electrode 214 made of a Ti electrode for body cleaning is provided on one side of the inside of the AIP apparatus 250, and a target (cathode electrode) 213 made of an Al—Cr—Si alloy is provided on the other side thereof. That is, the cathode electrodes 213 and 214 are disposed so as to face each other across the rotating table 201.

First, the tool bodies 2 made of tungsten carbide (WC)-based cemented carbide are cleaned and dried, and are mounted on the rotating table 201 in the AIP apparatus 250. Arc discharge of 100 A is generated between the Ti electrode 214 for body cleaning and an anode electrode 212 in a vacuum by an arc power supply 216, and the surfaces of the tool bodies 2 are subjected to bombardment cleaning while applying a bias voltage of −1000 V to the tool bodies 2 by a bias power supply 217.

Thereafter, a magnetic field is applied so that the magnetic force integrated from the center of the surface of the Al—Cr—Si alloy target 213 to the tool body 2 which is nearest to the target is 40 mT×mm to 150 mT×mm.

Next, nitrogen gas as a reaction gas is introduced into the apparatus 250 through a reaction gas inlet 203 so that an atmospheric pressure is 6 Pa inside the apparatus 250. While maintaining the temperature of the tool body 2 in 370° C. to 450° C., a bias voltage of −50 V is applied to the tool body 2 by the bias power supply 217 and arc discharge of 100 A is generated between the Al—Cr—Si alloy target (cathode electrode) 213 and an anode electrode 211 by an arc power supply 215. While supporting the tool body 2 on the rotating table 201 so that a portion or the entirety of the flank face 22 and the surface of the target 213 become horizontal when the tool body 2 is nearest to the target 213, and while rotating and revolving the tool body 2, vapor-deposition is performed. In the above-described method, the hard coating layer including the (Al, Cr, Si)N layer having the layer structure of this embodiment can be vapor-deposited.

In addition, in order to apply a magnetic field between the Al—Cr—Si alloy target 213 and the tool body 2, for example, a magnetic field can be formed by arbitrary means such as installing an electromagnetic coil or a permanent magnet as a magnetic field generation source in the periphery of the cathode electrode 213, specifically, at a position denoted by reference numeral 218 of FIGS. 5A and 5B, or disposing a permanent magnet at the center portion of the inside of the AIP apparatus 250.

Here, the integrated magnetic force in this embodiment is calculated by the following calculation method.

Magnetic flux densities on the straight line from the center of the Al—Cr—Si alloy target 213 to the position of the tool body 2 are measured at an interval of 10 mm by a magnetic flux density meter. The magnetic flux density is represented in terms of mT (millitesla), and the distance from the center of the surface of the target 213 to the position of the tool body 2 is represented in terms of mm (millimeter). Furthermore, in a case where a graph is plotted by using the distance from the center of the surface of the target 213 to the position of the tool body 2 as the horizontal axis and using the magnetic flux density as the vertical axis, a value corresponding to an area is defined as the integrated magnetic force (mT×mm).

Here, the position of the tool body 2 is a position where the tool body 2 is nearest to the Al—Cr—Si alloy target. In addition, the measurement of the magnetic flux density need not be performed during discharge as long as a magnetic field is formed. For example, the magnetic flux density may be measured in a state where discharge does not occur under the atmospheric pressure. In addition, regarding the "center of the target" or the "center of the surface of the target", when the target is circular, the center of the circle is the center of the target, and when the target is rectangular, the intersection of the diagonals thereof is the center of the target.

Next, the coated tool of the present invention will be described in detail with reference to Examples.

Example 1

As the raw material powders, a medium-coarse WC powder having an average grain size of 5.5 μm, a fine WC powder having an average grain size of 0.8 μm, a TaC powder having an average grain size of 1.3 μm, a NbC powder having an average grain size of 1.2 μm, a ZrC powder having an average grain size of 1.2 μm, a $Cr_3C_2$ powder having an average grain size of 2.3 μm, a VC powder having an average grain size of 1.5 μm, a (Ti, W)C [TiC/WC=50/50 in terms of mass ratio] powder having an average grain size of 1.0 μm, and a Co powder having an average grain size of 1.8 μm, were prepared. The raw material powders were mixed in compositions shown in Table 1. Wax was further added thereto. The mixture was blended in acetone by a ball mill for 24 hours and was dried under reduced pressure. Thereafter, the resultant was subjected to extrusion molding at a pressure of 100 MPa to be formed into various types of compacts having predetermined shapes. The compacts were heated to a predetermined temperature in a range of 1370° C. to 1470° C. in a vacuum atmosphere of 6 Pa at a heating rate of 7° C./min and were held at this temperature for one hour. Thereafter, the compacts were gradually cooled down in the furnace, thereby forming sintered round bar for forming tool bodies with a diameter of 10 mm. From the sintered round bar, by grinding, tool bodies (end mills) A1 to A3 made of WC-based cemented carbide having a two-edge ball shape with a helix angle of 30 degrees in dimensions of 6 mm×6 mm as the diameter× the length of the cutting edge portion, and tool bodies (end mills) A4 to A6 made of WC-based cemented carbide having a two-edge ball shape with a helix angle of 30 degrees in dimensions of 6 mm×12 mm as the diameter× the length of the cutting edge portion, were produced.

(a) Each of the tool bodies A1 to A6 was subjected to ultrasonic cleaning in acetone and was dried. In this state, the tool bodies A1 to A6 were mounted along the outer peripheral portion of the rotating table 101 of the AIP apparatus 150 shown in FIGS. 2A and 2B at positions distant from the center axis of the rotating table 101 in the radial direction by predetermined distances. The Ti cathode electrode 114 for bombardment cleaning was disposed on one side of the AIP apparatus 150 while the target (cathode electrode) 113 made of the Al—Cr—B alloy having a predetermined composition was disposed on the other side thereof.

(b) First, while the inside of the apparatus 150 was evacuated and maintained in a vacuum, the tool bodies 1 were heated to 400° C. by the heater 102. Then, a DC bias voltage of −1000 V was applied to the tool bodies 1 that were rotated and revolved on the rotating table 101, and arc discharge was generated by flowing a current of 100 A between the Ti cathode electrode 114 and the anode electrode 112, thereby subjecting the surface of the tool bodies 1 to bombardment cleaning.

(c) Subsequently, various magnetic fields were applied so that the magnetic force integrated from the center of the surface of the Al—Cr—B alloy target 113 to the tool bodies 1 was in a range of 40 mT×mm to 150 mT×mm.

Here, a method for calculating the integrated magnetic force will be described as follows. Magnetic flux densities on the straight line from the center of the Al—Cr—B alloy target 113 to the position of the tool body 1 were measured at an interval of 10 mm by a magnetic flux density meter. The magnetic flux density is represented in terms of mT (millitesla), and the distance from the surface of the target to the position of the tool body is represented in terms of mm (millimeter). Furthermore, in a case where a graph was plotted by using the distance from the center of the surface of the target 113 to the position of the tool body 1 as the horizontal axis and using the magnetic flux density as the vertical axis, a value corresponding to an area was defined as the integrated magnetic force (mT×mm). Here, as the position of the tool body 1, a position that is nearest to the Al—Cr—B alloy target 113 was determined. In addition, the magnetic flux density was measured in a state where discharge did not occur in advance under atmospheric pressure while a magnetic field was formed.

(d) Next, nitrogen gas as a reaction gas was introduced into the apparatus to form a reaction atmosphere at 6 Pa. While maintaining the temperature of the tool body 1 that was rotated and revolved on the rotating table 101 in a range of 370° C. to 450° C., a DC bias voltage of −50 V was applied, and arc discharge was generated by flowing a current of 100 A between the Al—Cr—B alloy target 113 and the anode electrode 111. Thereby, the hard coating layer 14 including a (Al, Cr, B)N layer having a composition and a desired average thickness shown in Table 2 was vapor-deposited on the surface of the tool body 1.

In this procedure, surface-coated end mills A1 to A10 as the coated tool of the present invention (hereinafter, referred to as Inventions A1 to A10) were produced.

Comparative Examples

For the purpose of comparison, by changing the conditions of (c) in Examples (that is, the magnetic force integrated from the center of the surface of the Al—Cr—B alloy target 113 to the tool body 1 was less than 40 mT×mm or more than 150 mT×mm), or by changing the conditions of (d) (that is, the tool body 1 was maintained at a temperature of lower than 370° C. or higher than 450° C.), and using the same conditions as those of Examples except for the changes, surface-coated end mills A1 to A5 as coated tools of comparative examples (hereinafter, referred to as Comparative Examples A1 to A5 were produced.

In addition, surface-coated end mills A6 to A10 (hereinafter, referred to as Comparative Examples A6 to A10) in which the ratio of the amount of Cr or B to the total amount of Al, Cr, and B in the coating layer was out of the range specified in the present invention or the average thickness of the coating layer was not in the range of 2 μm to 10 μm, were produced.

For Inventions A1 to A10 and Comparative Examples A1 to A10 produced as described above, the type of the crystal grains of the hard coating layer in the longitudinal sections thereof (faces perpendicular to the flank face) were observed. In all of the sections, each of the hard coating layers was formed of a structure having granular crystal grains with an aspect ratio of 1 to 6. The aspect ratio was calculated the ratio between the longest diameter (major axis) of a crystal grain in the section and the longest diameter (minor axis) among the diameters perpendicular to the major axis, using the major axis and the minor axis as the numerator and the denominator, respectively.

Furthermore, the grain sizes of the granular crystal grains were measured by a scanning electron microscope (SEM), and a surface grain size and a boundary surface grain size in an area within 100 μm from the edge tip on the flank face were obtained. Specifically, the grain sizes of all crystal grains in an area having a width of 10 μm were measured at three positions including a position (P11 and P14 of FIG. 3) immediately above the edge tip on the flank face in the boundary surface and the surface, a position (P12 and P15) distant from the edge tip on the flank face by 50 μm, and a position (P13 and P16) distant from the edge tip by 100 μm, and the surface grain size and the boundary surface grain size were obtained by calculating the average value of the grain sizes measured at the three positions.

In the same manner, in the area between the edge tip and 100 μm therefrom on the flank face, the grain size length ratio of crystal grains having a grain size of 0.1 μm or less was obtained by measuring the grain sizes at a total of six positions including the positions (P11 and P14) immediately above the edge tip on the flank face in the boundary surface and the surface, the positions (P12 and P15) distant from the edge tip on the flank face by 50 μm, and the positions (P13 and P16) distant from the edge tip by 100 μm.

In Tables 2 and 3, the measured and calculated values are shown.

A method for measuring the grain size and a method for measuring the grain size length ratio of crystal grains having a grain size of 0.1 μm or less will be described in more detail as follows.

After polishing the cross-section of the flank face including the corner portion of the tip of the cutting edge of the coated tool, the cross-section was observed on the SEM. As the measurement conditions, conditions of an observation magnification of 10,000-fold and an acceleration voltage of 3 kV were used. Each crystal grain formed in a region with a depth of 0.5 μm from the surface of the hard coating layer was used for the measurement. A straight line was drawn to be parallel to the surface (flank face) of the tool body, and the distance between the intersections of the straight line and the crystal grain boundary was defined as the grain size. In addition, the position at which the straight line was drawn to be parallel to the surface (flank face) of the tool body was set to a position at which the grain size of each crystal grain was the largest. The grain sizes of crystal grains were measured in the area between the edge tip and 100 μm therefrom on the flank face, specifically, in an area as measurement positions with a width of 10 μm at each of three positions including the position immediately above the edge tip on the flank face, the position distant from the edge tip on the flank face by 50 μm, and the position distant from the edge tip by 100 μm. The average value of the average grain sizes at the three positions was determined as the surface grain size. When the grain size in a region having a width of 10 μm was measured, crystal grains in a region within 5 μm on the edge tip side and within 5 μm on the opposite side of the edge tip from the center of each of the measurement positions (the positions at distances of 50 μm and 100 μm from the edge tip of the flank face), were used. Here, at the measurement positions of the edge tip on the flank face, measurement was performed in an area having a width of 10 μm within 5 μm on the edge tip side and within 5 μm on the opposite side of the edge tip from the position distant from the edge tip by 5 μm. In addition, regarding each crystal grain formed in a region having a thickness of 0.5 μm from the boundary surface between the tool body and the hard coating layer in the hard coating layer, the boundary surface grain size was calculated in the same manner.

In addition, in the method for measuring the grain size length ratio of crystal grains having a grain size of 0.1 μm or less, all of measurement data of the grain sizes measured at three positions on the boundary surface and the three positions on the surface where the grain sizes were measured, was used. The sum of grain sizes of crystal grains having a grain size of 0.1 μm or less to the sum of all of the measured grain sizes was determined as the grain size length ratio of crystal grains having a grain size of 0.1 μm or less.

TABLE 1

| | | Composition (mass %) | | | | | | | | Diameter × length of cutting edge |
|---|---|---|---|---|---|---|---|---|---|---|
| Type | | Co | (Ti, W)C | TaC | NbC | ZrC | $Cr_3C_2$ | VC | WC | portion (mm) |
| Tool body (End mill) | A1 | 5 | 5 | — | — | — | — | — | Medium-coarse powder: balance | 6 × 6 |
| | A2 | 6 | — | 1 | 0.5 | — | — | — | Fine powder: balance | 6 × 6 |
| | A3 | 6 | — | 1 | — | 1 | 0.5 | 0.5 | Fine powder: balance | 6 × 6 |

TABLE 1-continued

| Type | Composition (mass %) | | | | | | | Diameter × length of cutting edge portion (mm) |
|---|---|---|---|---|---|---|---|---|
| | Co | (Ti, W)C | TaC | NbC | ZrC | $Cr_3C_2$ | VC | WC | |
| A4 | 8 | — | — | — | — | 0.5 | 0.5 | Fine powder: balance | 6 × 12 |
| A5 | 9 | 25 | 10 | 1 | — | — | — | Medium-coarse powder: balance | 6 × 12 |
| A6 | 10 | — | — | — | — | 1 | — | Fine powder: balance | 6 × 12 |

TABLE 2

| Type | | Tool body symbol | Tool body temperature (° C.) | Integrated magnetic force (mT × mm) | (Al, Cr, B)N layer | | | | |
|---|---|---|---|---|---|---|---|---|---|
| | | | | | Composition (atomic ratio) | Average thickness (μm) | Surface grain size (μm) | (Note 1) Grain size difference (μm) | (Note 2) Grain size length ratio of crystal grains of ≤0.1 μm (%) |
| Inventions | A1 | A1 | 450 | 46 | Al69Cr30B1 | 3.5 | 0.18 | 0.04 | 17.5 |
| | A2 | A2 | 400 | 46 | Al68Cr29B3 | 8.2 | 0.21 | 0.04 | 5.6 |
| | A3 | A3 | 450 | 92 | Al67Cr28B5 | 4.6 | 0.38 | 0.10 | 2.8 |
| | A4 | A4 | 430 | 140 | Al69Cr30B1 | 5 | 0.25 | 0.02 | 7.4 |
| | A5 | A5 | 430 | 92 | Al68Cr29B3 | 2.7 | 0.12 | 0.03 | 10.3 |
| | A6 | A6 | 370 | 140 | Al45Cr45B10 | 3.2 | 0.25 | 0.05 | 11.5 |
| | A7 | A1 | 450 | 46 | Al60Cr37B3 | 6.4 | 0.15 | 0.02 | 16.7 |
| | A8 | A2 | 370 | 140 | Al57Cr38B5 | 2 | 0.21 | 0.07 | 19.3 |
| | A9 | A3 | 400 | 92 | Al63Cr27B10 | 4.3 | 0.19 | 0.03 | 9.4 |
| | A10 | A4 | 430 | 46 | Al71Cr24B5 | 7.1 | 0.31 | 0.08 | 4.2 |

(Note 1)
"Grain size difference" indicates the value of "(surface grain size) − (boundary surface grain size)."
(Note 2)
"Grain size length ratio of crystal grains of ≤0.1 μm (%)" indicates the ratio of grains of 0.1 μm or less at three positions including the edge tip on the flank face, a position distant from the edge tip on the flank face by 50 μm, and a position distant from the edge tip on the flank by 100 μm"

TABLE 3

| Type | | Tool body symbol | Tool body temperature (° C.) | Integrated magnetic force (mT × mm) | (Al, Cr, B)N layer | | | | |
|---|---|---|---|---|---|---|---|---|---|
| | | | | | Composition (atomic ratio) | Average thickness (μm) | Surface grain size (μm) | (Note 1) Grain size difference (μm) | (Note 2) Grain size length ratio of crystal grains of ≤0.1 μm (%) |
| Comparative Examples | A1 | A1 | 550 | 200 | Al69Cr30B1 | 4.8 | 0.08(*1) | 0.01(*1) | 81.5(*1) |
| | A2 | A2 | 350 | 384 | Al60Cr37B3 | 3.6 | 0.42(*1) | 0.09 | 1.2. |
| | A3 | A3 | 500 | 26 | Al67Cr28B5 | 5.4 | 0.09(*1) | 0.03 | 100(*1) |
| | A4 | A4 | 550 | 384 | Al68Cr29B3 | 8.2 | 0.44(*1) | 0.16(*1) | 2.6 |
| | A5 | A5 | 500 | 200 | Al45Cr45B10 | 9.5 | 0.24 | 0.12(*1) | 64.8(*1) |
| | A6 | A6 | 350 | 26 | Al60Cr37B3 | 1.5(*1) | 0.08(*1) | 0.01(*1) | 92.0(*1) |
| | A7 | A1 | 500 | 384 | Al71Cr24B5 | 11.0(*1) | 0.16 | 0.04 | 47.3(*1) |
| | A8 | A2 | 550 | 200 | Al78Cr17B5(*1) | 2.9 | 0.11 | 0.01(*1) | 68.2(*1) |
| | A9 | A3 | 350 | 384 | Al40Cr50B10(*1) | 6.1 | 0.18 | 0.10 | 34.1(*1) |
| | A10 | A4 | 500 | 26 | Al42Cr43B15(*1) | 3.4 | 0.29 | 0.07 | 13.5 |

(Note 1)
"Grain size difference" indicates the value of "(surface grain size) − (boundary surface grain size)."
(Note 2)
"Grain size length ratio of crystal grains of ≤0.1 μm (%)" indicates the ratio of grains of 0.1 μm or less at three positions including the edge tip on the flank face, a position distant from the edge tip on the flank face by 50 μm, and a position distant from the edge tip on the flank by 100 μm.
(*1) indicates out of the range of the present invention.

Next, a cutting test, shoulder cutting of high hardness steel (SKD61 specified in JIS G 4404:2006 (corresponding to ISO 40 CrMoV5, a Rockwell hardness of HRC52)) was carried out using the end mills of Invention A1 to A10 and Comparative Examples A1 to A10 under the following conditions (referred to as cutting conditions A).

Work material—a plate material made of JIS SKD61 (HRC52) having planar dimensions of 100 mm×250 mm and a thickness of 50 mm Rotational speed: 17,000 min.$^{-1}$
Cutting depth in a longitudinal direction: 2.0 mm
Cutting depth in a transverse direction: 0.3 mm
Feed rate (per tooth): 0.05 mm/tooth
Cutting length: 250 m
Cutting method: air blowing Furthermore, a cutting test, shoulder cutting of high hardness steel (SKD11 specified in JIS G 4404:2006 (corresponding to AISI D2, HRC60)) was carried out under the following conditions (referred to as cutting conditions B).

Work material—a plate material made of JIS SKD11 (HRC60) having planar dimensions of 100 mm×250 mm and a thickness of 50 mm Rotational speed: 5400 min.$^{-1}$
Cutting depth in a longitudinal direction: 2.0 mm
Cutting depth in a transverse direction: 0.2 mm
Feed rate (per tooth): 0.05 mm/tooth
Cutting length: 30 m
Cutting method: air blowing In both of the shoulder cutting tests, the wear width of the flank face of the cutting edge was measured.

The measurement results are shown in Table 4.

In addition, the shoulder cutting test is a test for machining a side face of a work material as an object under the above-described cutting conditions and evaluating the damaged status of the tools at this time.

TABLE 4

| Type | | Flank face wear width (mm) | |
|---|---|---|---|
| | | Cutting conditions (A) | Cutting conditions (B) |
| Inventions | A1 | 0.063 | 0.042 |
| | A2 | 0.082 | 0.053 |
| | A3 | 0.035 | 0.079 |
| | A4 | 0.065 | 0.038 |
| | A5 | 0.033 | 0.056 |
| | A6 | 0.042 | 0.081 |
| | A7 | 0.086 | 0.037 |
| | A8 | 0.053 | 0.049 |
| | A9 | 0.082 | 0.067 |
| | A10 | 0.047 | 0.083 |
| Comparative Examples | A1 | 215(*) | 20(*) |
| | A2 | 0.250 | 15(*) |
| | A3 | 150(*) | 22(*) |
| | A4 | 0.126 | 0.215 |
| | A5 | 146(*) | 0.352 |
| | A6 | 120(*) | 10(*) |
| | A7 | 0.222 | 18(*) |
| | A8 | 0.360 | 0.162 |
| | A9 | 165(*) | 0.236 |
| | A10 | 0.155 | 5(*) |

(In the table, (*) in the fields of Comparative Examples indicates a cutting length (m) until the end of the service life (flank face wear width of 0.1 mm) due to chipping or wear)

As the results shown in Table 2, in the coated tools of the present invention (Inventions A1 to A10), the surface grain size and the boundary surface grain size of the granular crystal grains of the hard coating layer including the (Al, Cr, B)N layer were set to be in specific numeral value ranges. In addition, the grain size length ratio of crystal grains having a grain size of 0.1 μm or less in the area between the edge tip and 100 μm therefrom on the flank face was set to be 20% or less. Therefore, the coated tools of the present invention (Inventions A1 to A10) exhibited excellent chipping resistance and excellent wear resistance during cutting of high hardness steel such as hardened steel, as shown in Table 4.

Contrary to this, in the coated tools of Comparative Examples (Comparative Examples A1 to A10), the structure of the hard coating layer was out of the range specified in the present invention, as shown in Table 3. Therefore, as shown in Table 4, the coated tools of Comparative Examples (Comparative Examples A1 to A10) reached the tool lives within a relatively short time due to the occurrence of chipping or the degradation of wear resistance.

Next, the coated tool of the present invention will be described in detail with reference to Examples.

Example 2

As the raw material powders, a medium-coarse WC powder having an average grain size of 5.5 μm, a fine WC powder having an average grain size of 0.8 μm, a TaC powder having an average grain size of 1.3 μm, a NbC powder having an average grain size of 1.2 μm, a ZrC powder having an average grain size of 1.2 μm, a $Cr_3C_2$ powder having an average grain size of 2.3 μm, a VC powder having an average grain size of 1.5 μm, a (Ti, W)C [TiC/WC=50/50 in terms of mass ratio] powder having an average grain size of 1.0 μm, and a Co powder having an average grain size of 1.8 μm, were prepared. The raw material powders were mixed in compositions shown in Table 5. Wax was further added thereto. The mixture was blended in acetone by a ball mill for 24 hours and was dried under reduced pressure. Thereafter, the resultant was subjected to extrusion molding at a pressure of 100 MPa to be formed into various types of compacts having predetermined shapes. The compacts were heated to a predetermined temperature in a range of 1370° C. to 1470° C. in a vacuum atmosphere of 6 Pa at a heating rate of 7° C./min and were held at this temperature for one hour. Thereafter, the compacts were gradually cooled down in the furnace, thereby forming sintered round bar for forming tool bodies with a diameter of 10 mm. From the sintered round bar, by grinding, tool bodies (end mills) B1 to B3 made of WC-based cemented carbide having a two-edge ball shape with a helix angle of 30 degrees in dimensions of 6 mm×6 mm as the diameter× the length of the cutting edge portion, and tool bodies (end mills) B4 to B6 made of WC-based cemented carbide having a two-edge ball shape with a helix angle of 30 degrees in dimensions of 6 mm×12 mm as the diameter× the length of the cutting edge portion, were produced.

(a) Each of the tool bodies B1 to B6 was subjected to ultrasonic cleaning in acetone and was dried. In this state, the tool bodies B1 to B6 were mounted along the outer peripheral portion of the rotating table 201 of the AIP apparatus 250 shown in FIGS. 5A and 5B at positions distant from the center axis of the rotating table 201 in the radial direction by predetermined distances. The Ti cathode electrode 214 for bombardment cleaning was disposed on one side of the AIP apparatus 250 while the target (cathode electrode) 213 made of the Al—Cr—Si alloy having a predetermined composition was disposed on the other side thereof.

(b) First, while the inside of the apparatus 250 was evacuated and maintained in a vacuum, the tool bodies 2 were heated to 400° C. by the heater 202. Then, a DC bias voltage of −1000 V was applied to the tool bodies 2 that were rotated and revolved on the rotating table 201, and arc discharge was generated by flowing a current of 100 A between the Ti cathode electrode 214 and the anode electrode 212, thereby subjecting the surface of the tool bodies 2 to bombardment cleaning.

(c) Subsequently, various magnetic fields were applied so that the magnetic force integrated from the center of the surface of the Al—Cr—Si alloy target 213 to the tool bodies 2 was in a range of 40 mT×mm to 150 mT×mm.

Here, a method for calculating the integrated magnetic force will be described as follows. Magnetic flux densities on the straight line from the center of the Al—Cr—Si alloy target 213 to the position of the tool body 2 were measured at an interval of 10 mm by a magnetic flux density meter. The magnetic flux density is represented in terms of mT (millitesla), and the distance from the surface of the target to the position of the tool body is represented in terms of mm (millimeter). Furthermore, in a case where a graph was plotted by using the distance from the center of the surface of the target 213 to the position of the tool body 2 as the horizontal axis and using the magnetic flux density as the vertical axis, a value corresponding to an area was defined as the integrated magnetic force (mT×mm). Here, as the position of the tool body 2, a position that is nearest to the Al—Cr—Si alloy target 213 was determined. In addition, the magnetic flux density was measured in a state where discharge did not occur in advance under atmospheric pressure while a magnetic field was formed.

(d) Next, nitrogen gas as a reaction gas was introduced into the apparatus to form a reaction atmosphere at 6 Pa. While maintaining the temperature of the tool body 2 that was rotated and revolved on the rotating table 201 in a range of 370° C. to 450° C., a DC bias voltage of −50 V was applied, and arc discharge was generated by flowing a current of 100 A between the Al—Cr—Si alloy target 213 and the anode electrode. Thereby, the hard coating layer including a (Al, Cr, Si)N layer having a composition and a desired average thickness shown in Table 6 was vapor-deposited on the surface of the tool body.

In this procedure, surface-coated end mills B1 to B10 as the coated tool of the present invention (hereinafter, referred to as Inventions B1 to B10) were produced.

Comparative Examples

For the purpose of comparison, by changing the conditions of (c) in Examples (that is, the magnetic force integrated from the center of the surface of the Al—Cr—Si alloy target to the tool body 2 was less than 40 mT×mm or more than 150 mT×mm), or by changing the conditions of (d) (that is, the tool body was maintained at a temperature of lower than 370° C. or higher than 450° C.), and using the same conditions as those of Examples except for the changes, surface-coated end mills B1 to B5 as coated tools of comparative examples (hereinafter, referred to as Comparative Examples B1 to B5) were produced.

In addition, surface-coated end mills B6 to B10 (hereinafter, referred to as Comparative Examples B6 to B10) in which the ratio of the amount of Cr or Si to the total amount of Al, Cr, and Si in the coating layer was out of the range specified in the present invention or the average thickness of the coating layer was not in the range of 2 μm to 10 μm, were produced.

For Inventions B1 to B10 and Comparative Examples B1 to B10 produced as described above, the type of the crystal grains of the hard coating layer in the longitudinal sections thereof (faces perpendicular to the flank face) were observed. In all of the sections, each of the hard coating layers was formed of a structure having granular crystal grains with an aspect ratio of 1 to 6. The aspect ratio was calculated the ratio between the longest diameter (major axis) of a crystal grain in the section and the longest diameter (minor axis) among the diameters perpendicular to the major axis, using the major axis and the minor axis as the numerator and the denominator, respectively.

Furthermore, the grain sizes of the granular crystal grains were measured by a scanning electron microscope (SEM), and a surface grain size and a boundary surface grain size in an area within 100 μm from the edge tip on the flank face were obtained. Specifically, the grain sizes of all crystal grains in an area having a width of 10 μm were measured at three positions including a position (P21 and P24 of FIG. 6) immediately above the edge tip on the flank face in the boundary surface and the surface, a position (P22 and P25) distant from the edge tip on the flank face by 50 μm, and a position (P23 and P26) distant from the edge tip by 100 μm, and the surface grain size and the boundary surface grain size were obtained by calculating the average value of the grain sizes measured at the three positions.

In the same manner, in the area between the edge tip and 100 μm therefrom on the flank face, the grain size length ratio of crystal grains having a grain size of 0.1 μm or less was obtained by measuring the grain sizes at a total of six positions including the positions (P21 and P24) immediately above the edge tip on the flank face in the boundary surface and the surface, the positions (P22 and P25) distant from the edge tip on the flank face by 50 μm, and the positions (P23 and P26) distant from the edge tip by 100 μm.

In Tables 6 and 7, the measured and calculated values are shown.

A method for measuring the grain size and a method for measuring the grain size length ratio of crystal grains having a grain size of 0.1 μm or less will be described in more detail as follows.

After polishing the cross-section of the flank face including the corner portion of the tip of the cutting edge of the coated tool, the cross-section was observed on the SEM. As the measurement conditions, conditions of an observation magnification of 10,000-fold and an acceleration voltage of 3 kV were used. Each crystal grain formed in a region with a depth of 0.5 μm from the surface of the hard coating layer was used for the measurement. A straight line was drawn to be parallel to the surface (flank face) of the tool body, and the distance between the intersections of the straight line and the crystal grain boundary was defined as the grain size. In addition, the position at which the straight line was drawn to be parallel to the surface (flank face) of the tool body was set to a position at which the grain size of each crystal grain was the largest. The grain sizes of crystal grains were measured in the area between the edge tip and 100 μm therefrom on the flank face, specifically, in an area as measurement positions with a width of 10 μm at each of three positions including the position immediately above the edge tip on the flank face, the position distant from the edge tip on the flank face by 50 μm, and the position distant from the edge tip by 100 μm. The average value of the average grain sizes at the three positions was determined as the surface grain size. When the grain size in a region having a width of 10 μm was measured, crystal grains in a region within 5 μm on the edge tip side and within 5 μm on the opposite side of the edge tip from the center of each of the measurement positions (the positions at distances of 50 μm and 100 μm from the edge tip of the flank face), were used. Here, at the measurement positions of the edge tip on the flank face, measurement was performed in an area having a width of 10 μm within 5 μm on the edge tip side and within 5 μm on the opposite side of the edge tip from the position distant from the edge tip by 5 μm. In addition, regarding each crystal grain formed in a region having a thickness of 0.5 μm from the boundary surface between the tool body and the hard coating layer in the hard coating layer, the boundary surface grain size was calculated in the same manner.

In addition, in the method for measuring the grain size length ratio of crystal grains having a grain size of 0.1 μm or less, all of measurement data of the grain sizes measured at three positions on the boundary surface and the three positions on the surface where the grain sizes were measured, was used. The sum of grain sizes of crystal grains having a grain size of 0.1 μm or less to the sum of all of the measured grain sizes was determined as the grain size length ratio of crystal grains having a grain size of 0.1 μm or less.

TABLE 5

| Type | | Co | (Ti, W)C | TaC | NbC | ZrC | Cr$_3$C$_2$ | VC | WC | Diameter × length of cutting edge portion (mm) |
|---|---|---|---|---|---|---|---|---|---|---|
| Tool body (End mill) | B1 | 5 | 5 | — | — | — | — | — | Medium-coarse powder: balance | 6 × 6 |
| | B2 | 6 | — | 1 | 0.5 | — | — | — | Fine powder: balance | 6 × 6 |
| | B3 | 6 | — | 1 | — | 1 | 0.5 | 0.5 | Fine powder: balance | 6 × 6 |
| | B4 | 8 | — | — | — | — | 0.5 | 0.5 | Fine powder: balance | 6 × 12 |
| | B5 | 9 | 25 | 10 | 1 | — | — | — | Medium-coarse powder: balance | 6 × 12 |
| | B6 | 10 | — | — | — | — | 1 | — | Fine powder: balance | 6 × 12 |

TABLE 6

| Type | | Tool body symbol | Tool body temperature (° C.) | Integrated magnetic force (mT × mm) | (Al, Cr, Si)N layer | | | | |
|---|---|---|---|---|---|---|---|---|---|
| | | | | | Composition (atomic ratio) | Average thickness (μm) | Surface grain size (μm) | (Note 1) Grain size difference (μm) | (Note 2) Grain size length ratio of crystal grains of ≤0.1 μm (%) |
| Inventions | B1 | B1 | 450 | 92 | Al69Cr30Si1 | 4 | 0.32 | 0.03 | 18.5 |
| | B2 | B2 | 370 | 140 | Al68Cr29Si3 | 5.5 | 0.25 | 0.06 | 16.8 |
| | B3 | B3 | 430 | 46 | Al60Cr37Si3 | 2.1 | 0.24 | 0.05 | 3.5 |
| | B4 | B4 | 400 | 92 | Al67Cr28Si5 | 7.0 | 0.32 | 0.08 | 5.2 |
| | B5 | B5 | 430 | 92 | Al57Cr38Si5 | 6.2 | 0.4 | 0.05 | 10.6 |
| | B6 | B6 | 370 | 140 | Al45Cr45Si10 | 9.5 | 0.35 | 0.1 | 8.8 |
| | B7 | B1 | 400 | 46 | Al65Cr34Si1 | 2.7 | 0.26 | 0.04 | 12.4 |
| | B8 | B2 | 400 | 92 | Al68Cr29Si3 | 3.3 | 0.1 | 0.02 | 17.8 |
| | B9 | B3 | 450 | 140 | Al67Cr28Si5 | 3.6 | 0.21 | 0.07 | 15.2 |
| | B10 | B4 | 430 | 92 | Al42Cr43Si15 | 5.3 | 0.18 | 0.03 | 4.3 |

(Note 1)
"Grain size difference" indicates the value of "(surface grain size) − (boundary surface grain size)."
(Note 2)
"Grain size length ratio of crystal grains of ≤0.1 μm (%)" indicates the ratio of grains of 0.1 μm or less at three positions including the edge tip on the flank face, a position distant from the edge tip on the flank face by 50 μm, and a position distant from the edge tip on the flank face by 100 μm.

TABLE 7

| Type | | Tool body symbol | Tool body temperature (° C.) | Integrated magnetic force (mT × mm) | (Al, Cr, Si)N layer | | | | |
|---|---|---|---|---|---|---|---|---|---|
| | | | | | Composition (atomic ratio) | Average thickness (μm) | Surface grain size (μm) | (Note 1) Grain size difference (μm) | (Note 2) Grain size length ratio of crystal grains of ≤0.1 μm (%) |
| Comparative Examples | B1 | B1 | 350 | 200 | Al69Cr39Si1 | 2.5 | 0.13 | 0.03 | 86.4(*1) |
| | B2 | B2 | 500 | 26 | Al68Cr29Si3 | 4.2 | 0.07(*1) | 0.02 | 100(*1) |
| | B3 | B3 | 550 | 200 | Al57Cr38Si5 | 7.3 | 0.48(*1) | 0.12(*1) | 8.5 |
| | B4 | B4 | 350 | 26 | Al67Cr28Si5 | 5.2 | 0.09(*1) | 0.01(*1) | 93.1(*1) |
| | B5 | B5 | 500 | 384 | Al45Cr45Si10 | 4.1 | 0.44(*1) | 0.08 | 5.2 |
| | B6 | B6 | 550 | 26 | Al69Cr39Si1 | 11.5(*1) | 0.16 | 0.07 | 27.6(*1) |
| | B7 | B1 | 500 | 200 | Al68Cr29Si3 | 1.4(*1) | 0.21 | 0.02 | 8.4 |
| | B8 | B2 | 350 | 384 | Al78Cr17Si5(*1) | 6.2 | 0.12 | 0.03 | 89.8(*1) |
| | B9 | B3 | 550 | 200 | Al40Cr50Si10(*1) | 2.8 | 0.30 | 0.07 | 6.7 |
| | B10 | B4 | 350 | 26 | Al40Cr40Si20(*1) | 3.5 | 0.13 | 0.04 | 10.8 |

(Note 1)
"Grain size difference" indicates the value of "(surface grain size) − (boundary surface grain size)."
(Note 2)
"Grain size length ratio of crystal grains of ≤0.1 μm (%)" indicates the ratio of grains of 0.1 μm or less at three positions including the edge tip on the flank face, a position distant from the edge tip on the flank face by 50 μm, and a position distant from the edge tip on the flank face by 100 μm.
(*1) indicates out of the range of the present invention.

Next, a cutting test, shoulder cutting of high hardness steel (SKD61 specified in JIS G 4404:2006 (corresponding to ISO 40 CrMoV5, a Rockwell hardness of HRC52)) was carried out using the end mills of Invention B1 to B10 and Comparative Examples B1 to B10 under the following conditions (referred to as cutting conditions A).

Work material—a plate material made of JIS SKD61 (HRC52) having planar dimensions of 100 mm×250 mm and a thickness of 50 mm
   Rotational speed: 17,000 min.$^{-1}$
   Cutting depth in a longitudinal direction: 2.0 mm
   Cutting depth in a transverse direction: 0.3 mm
   Feed rate (per tooth): 0.05 mm/tooth
   Cutting length: 250 m
   Cutting method: air blowing Furthermore, a cutting test, shoulder cutting of high hardness steel (SKD11 specified in JIS G 4404:2006 (corresponding to AISI D2, HRC60)) was carried out under the following conditions (referred to as cutting conditions B).

Work material—a plate material made of JIS SKD11 (HRC60) having planar dimensions of 100 mm×250 mm and a thickness of 50 mm
   Rotational speed: 5400 min.$^{-1}$
   Cutting depth in a longitudinal direction: 2.0 mm
   Cutting depth in a transverse direction: 0.2 mm
   Feed rate (per tooth): 0.05 mm/tooth
   Cutting length: 30 m
   Cutting method: air blowing In both of the shoulder cutting tests, the wear width of the flank face of the cutting edge was measured.

The measurement results are shown in Table 8.

In addition, the shoulder cutting test is a test for machining a side face of a work material as an object under the above-described cutting conditions and evaluating the damaged status of the tools at this time.

TABLE 8

| Type | | Flank face wear width (mm) | |
|---|---|---|---|
| | | Cutting conditions (A) | Cutting conditions (B) |
| Inventions | B1 | 0.055 | 0.086 |
| | B2 | 0.030 | 0.053 |
| | B3 | 0.082 | 0.077 |
| | B4 | 0.047 | 0.042 |
| | B5 | 0.073 | 0.068 |
| | B6 | 0.088 | 0.038 |
| | B7 | 0.050 | 0.073 |
| | B8 | 0.069 | 0.059 |
| | B9 | 0.037 | 0.047 |
| | B10 | 0.091 | 0.061 |
| Comparative Examples | B1 | 0.157 | 25(*) |
| | B2 | 0.125 | 0.185 |
| | B3 | 180(*) | 15(*) |
| | B4 | 155(*) | 23(*) |
| | B5 | 0.232 | 15(*) |
| | B6 | 0.183 | 22(*) |
| | B7 | 200(*) | 25(*) |
| | B8 | 110(*) | 10(*) |
| | B9 | 0.210 | 0.245 |
| | B10 | 143(*) | 18(*) |

(In the table, (*) in the fields of Comparative Examples indicates a cutting length (m) until the end of the service life (flank face wear width of 0.1 mm) due to chipping or wear)

As the results shown in Table 6, in the coated tools of the present invention (Inventions B1 to B10), the surface grain size and the boundary surface grain size of the granular crystal grains of the hard coating layer including the (Al, Cr, Si)N layer were set to be in specific numeral value ranges. In addition, the grain size length ratio of crystal grains having a grain size of 0.1 μm or less in the area between the edge tip and 100 μm therefrom on the flank face was set to be 20% or less. Therefore, the coated tools of the present invention (Inventions B1 to B10) exhibited excellent chipping resistance and excellent wear resistance during cutting of high hardness steel such as hardened steel, as shown in Table 8.

Contrary to this, in the coated tools of Comparative Examples (Comparative Examples B1 to B10), the structure of the hard coating layer was out of the range specified in the present invention, as shown in Table 7. Therefore, as shown in Table 8, the coated tools of Comparative Examples (Comparative Examples B1 to B10) reached the tool lives within a relatively short time due to the occurrence of chipping or the degradation of wear resistance.

While the preferred examples of the present invention have been described above, the present invention is not limited to the examples. Additions, omissions, and substitutions of the configurations and other changes can be made without departing from the spirit of the present invention. The present invention is not limited to the above description and is limited only by the claims.

In addition, there is no problem if unavoidable impurities are contained in the hard coating layer of the coated tool of the present invention since each layer may substantially have the composition described in the claims.

INDUSTRIAL APPLICABILITY

As described above, in a case where the coated tool of the present invention is provided for cutting high hardness steel such as hardened steel, the coated tool exhibits excellent cutting performance over a long period of time. Therefore, factory automation of machine tools, power saving and energy saving during cutting, and a further reduction in cost can be sufficiently satisfied.

REFERENCE SIGNS LIST

1 TOOL BODY
12 FLANK FACE
13 RAKE FACE
14 HARD COATING LAYER
15 CORNER PORTION
100 ARC ION PLATING APPARATUS (AIP APPARATUS)
101 ROTATING TABLE
102 HEATER
103 REACTION GAS INLET
104 GAS OUTLET
111 ANODE ELECTRODE
112 ANODE ELECTRODE
113 CATHODE ELECTRODE
114 CATHODE ELECTRODE
115 ARC POWER SUPPLY
116 ARC POWER SUPPLY
117 BIAS POWER SUPPLY
121 EDGE TIP OF FLANK FACE
131 EDGE TIP OF RAKE FACE

The invention claimed is:
1. A surface-coated cutting tool, comprising:
   a hard coating layer which is vapor-deposited on a surface of a tool body made of tungsten carbide-based cemented carbide and has an average thickness of 2 μm to 10 μm, wherein

(a) the hard coating layer comprises a layer made of complex nitride of Al, Cr, and B in which a ratio (atomic ratio) of the amount of Cr is 0.2 to 0.45 and a ratio (atomic ratio) of the amount of B is 0.01 to 0.1 to the total amount of Al, Cr, and B, and (b) in an area within 100 μm from an edge tip on a flank face of the surface-coated cutting tool, the hard coating layer has a granular grain structure, the average grain size of granular crystal grains is 0.1 μm to 0.4 μm on the surface of the hard coating layer, the average grain size of granular crystal grains on the boundary surface between the tool body and the hard coating layer is 0.02 μm to 0.1 μm smaller than that on the surface of the hard coating layer, and a grain size length ratio of crystal grains having a grain size of 0.1 μm or less is 20% or less.

2. The surface-coated cutting tool according to claim 1, wherein in an area within 100 μm from an edge tip on a flank face of the surface-coated cutting tool, the average aspect ratio of the crystal grains is 1 to 6.

3. A surface-coated cutting tool, comprising:
a hard coating layer which is vapor-deposited on a surface of a tool body made of tungsten carbide-based cemented carbide and has an average thickness 2 μm and 10 μm, wherein (a) the hard coating layer comprises a layer made of complex nitride of Al, Cr, and Si in which a ratio (atomic ratio) of the amount of Cr is 0.2 to 0.45 and a ratio (atomic ratio) of the amount of Si is 0.01 to 0.15 to the total amount of Al, Cr, and Si, and (b) in an area within 100 μm from an edge tip on a flank face of the surface-coated cutting tool, the hard coating layer has a granular crystal grain structure, the average grain size of granular crystal grains is 0.1 μm to 0.4 μm on the surface of the hard coating layer, the average grain size of granular crystal grains on the boundary surface between the tool body and the hard coating layer is 0.02 μm to 0.1 μm smaller than that on the surface of the hard coating layer, and a grain size length ratio of crystal grains having a grain size of 0.1 μm or less is 20% or less.

4. The surface-coated cutting tool according to claim 3, wherein
in an area within 100 μm from an edge tip on a flank face of the surface-coated cutting tool, the average aspect ratio of the crystal grains is 1 to 6.

5. A method for producing a surface-coated cutting tool having a hard coating layer which is vapor-deposited on a surface of a tool body made of tungsten carbide-based cemented carbide, wherein
the hard coating layer comprises a layer made of complex nitride of Al, Cr, and B in which a ratio (atomic ratio) of the amount of Cr is 0.2 to 0.45 and a ratio (atomic ratio) of the amount of B is 0.01 to 0.1 to the total amount of Al, Cr, and B, and
the method comprises vapor-depositing the hard coating layer on the surface of the tool body, while maintaining the temperature of the tool body in 370° C. to 450° C., rotating and revolving the tool body, and applying a magnetic field set so that the integrated magnetic force is 40 mT×mm to 150 mT×mm between the Al—Cr—B alloy target and the tool body.

6. The method for producing a surface-coated cutting tool according to claim 5, wherein
before the hard coating layer is vapor-deposited on the surface of the tool body, the surface of the tool body is subjected to bombardment cleaning by generating arc discharge between a Ti electrode and an anode electrode while applying bias voltage to the tool body.

7. The method for producing a surface-coated cutting tool according to claim 5, wherein
the hard coating layer is vapor-deposited on the surface of the tool body, while applying a bias voltage to the tool body.

8. The method for producing a surface-coated cutting tool according to claim 7, wherein
before the hard coating layer is vapor-deposited on the surface of the tool body, the surface of the tool body is subjected to bombardment cleaning by generating arc discharge between a Ti electrode and an anode electrode while applying bias voltage to the tool body.

9. A method for producing a surface-coated cutting tool having a hard coating layer which is vapor-deposited on a surface of a tool body made of tungsten carbide-based cemented carbide, wherein
the hard coating layer comprises a layer made of complex nitride of Al, Cr, and Si in which a ratio (atomic ratio) of the amount of Cr is 0.2 to 0.45 and a ratio (atomic ratio) of the amount of Si is 0.01 to 0.15 to the total amount of Al, Cr, and Si, and
the method comprises vapor-depositing the hard coating layer on the surface of the tool body, while maintaining the temperature of the tool body in 370° C. to 450° C., rotating and revolving the tool body, and applying a magnetic field set so that the integrated magnetic force is 40 mT×mm to 150 mT×mm between the Al—Cr—Si alloy target and the tool body.

10. The method for producing a surface-coated cutting tool according to claim 9, wherein
before the hard coating layer is vapor-deposited on the surface of the tool body, the surface of the tool body is subjected to bombardment cleaning by generating arc discharge between a Ti electrode and an anode electrode while applying bias voltage to the tool body.

11. The method for producing a surface-coated cutting tool according to claim 9, wherein
the hard coating layer is vapor-deposited on the surface of the tool body, while applying a bias voltage to the tool body.

12. The method for producing a surface-coated cutting tool according to claim 11, wherein
before the hard coating layer is vapor-deposited on the surface of the tool body, the surface of the tool body is subjected to bombardment cleaning by generating arc discharge between a Ti electrode and an anode electrode while applying bias voltage to the tool body.

* * * * *